United States Patent
He

(10) Patent No.: US 9,285,443 B2
(45) Date of Patent: Mar. 15, 2016

(54) MSC-SELMQC METHOD FOR SIMULTANEOUS MAPPING OF POLYUNSATURATED FATTY ACIDS, LACTATE AND CHOLINE IN HIGH FAT TISSUES

(75) Inventor: Qiuhong He, Wexford, PA (US)

(73) Assignee: University of Pittsburgh—Of the Commonwealth System of Higher Education, Pittsburgh, PA (US)

( * ) Notice: Subject to any disclaimer, the term of this patent is extended or adjusted under 35 U.S.C. 154(b) by 893 days.

(21) Appl. No.: 13/501,000

(22) PCT Filed: Apr. 15, 2011

(86) PCT No.: PCT/US2011/032691
§ 371 (c)(1),
(2), (4) Date: Jun. 26, 2012

(87) PCT Pub. No.: WO2011/130633
PCT Pub. Date: Oct. 20, 2011

(65) Prior Publication Data
US 2012/0274323 A1    Nov. 1, 2012

Related U.S. Application Data

(63) Continuation-in-part of application No. 12/266,007, filed on Nov. 6, 2008.

(60) Provisional application No. 61/324,796, filed on Apr. 16, 2010, provisional application No. 60/986,253, filed on Nov. 7, 2007.

(51) Int. Cl.
| | |
|---|---|
| *G01V 3/00* | (2006.01) |
| *G01R 33/46* | (2006.01) |
| *G01R 33/12* | (2006.01) |
| *G01R 33/34* | (2006.01) |
| *G01R 33/485* | (2006.01) |
| *G01R 33/56* | (2006.01) |

(52) U.S. Cl.
CPC ........ *G01R 33/4608* (2013.01); *G01R 33/1284* (2013.01); *G01R 33/34046* (2013.01); *G01R 33/485* (2013.01); *G01R 33/5607* (2013.01)

(58) Field of Classification Search
CPC ...................................................... G01R 33/485
USPC .......................................... 324/307, 309, 314
See application file for complete search history.

(56) References Cited

U.S. PATENT DOCUMENTS

| | | | | |
|---|---|---|---|---|
| 5,327,086 | A | * | 7/1994 | Bodenhausen et al. ........ 324/307 |
| 5,818,230 | A | * | 10/1998 | Katz et al. ..................... 324/309 |

(Continued)

OTHER PUBLICATIONS

"International Search Report," completed Dec. 21, 2011 and mailed Dec. 22, 2011.

*Primary Examiner* — Louis Arana
(74) *Attorney, Agent, or Firm* — Kegler Brown Hill & Ritter Co., L.P.A.; James J. Pingor

(57) ABSTRACT

Systems and methods employing spin editing techniques to improve magnetic resonance spectroscopy (MRS) and magnetic resonance spectroscopic imaging (MRSI) are discussed. Using these spin editing techniques, magnetic resonance signals of one or more unwanted chemicals (that is, chemicals whose signals are to be filtered out or suppressed) chemicals can be suppressed, so that the signal(s) of a first set of chemicals can be obtained without signals from the one or more unwanted chemicals. Information about and differences between the molecular topologies of the first set of chemicals and the one or more unwanted chemicals can be used to design a sequence that suppresses the one or more unwanted chemicals while allowing acquisition of signal(s) from the first set of chemicals.

17 Claims, 16 Drawing Sheets

(56) References Cited

U.S. PATENT DOCUMENTS

| | | | |
|---|---|---|---|
| 6,133,736 A * | 10/2000 | Pervushin et al. ............ 324/307 |
| 6,373,250 B1 | 4/2002 | Tsoref et al. |
| 6,528,997 B2 | 3/2003 | Zhong et al. |
| 6,696,889 B2 | 2/2004 | Watanabe |

* cited by examiner

BUTTERFLY COIL

SINGLE-LOOP TAPE COIL

BUTTERFLY TAPE COIL

VOLUME COIL

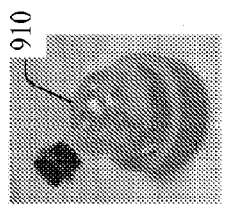
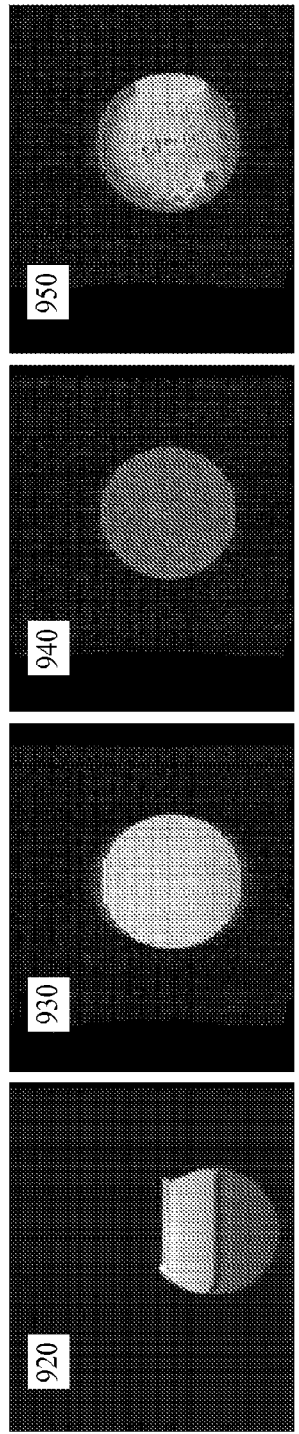
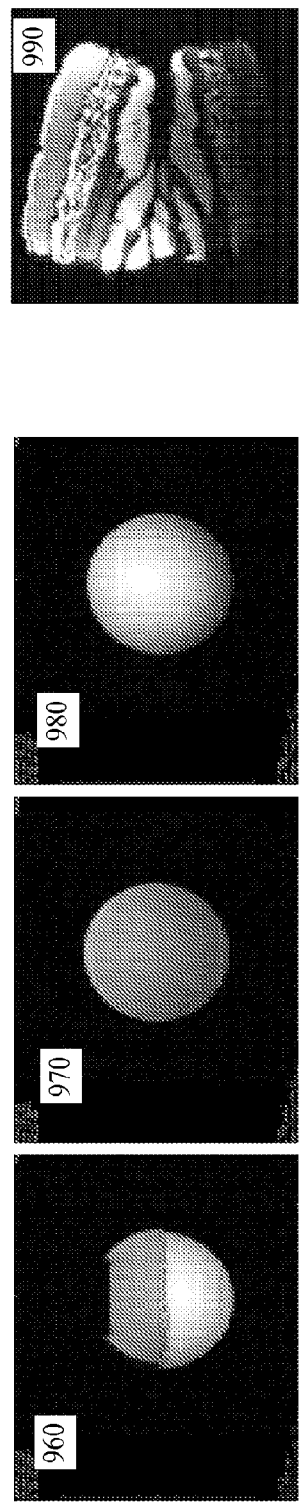
FIG. 9A
FIG. 9B
FIG. 9C

MSC-SELMQC METHOD FOR SIMULTANEOUS MAPPING OF POLYUNSATURATED FATTY ACIDS, LACTATE AND CHOLINE IN HIGH FAT TISSUES

CROSS-REFERENCE TO RELATED APPLICATIONS

This application claims the benefit of U.S. Provisional Application Ser. No. 61/324,796 filed on Apr. 16, 2010, entitled "MSC-SELMQC METHOD FOR SIMULTANEOUS MAPPING OF POLYUNSATURATED FATTY ACIDS, LACTATE AND CHOLINE IN HIGH FAT TISSUES," and International Application Serial No. PCT/US11/32691 filed on Apr. 15, 2011. This application is a Continuation-in-Part of pending U.S. patent application Ser. No. 12/266,007 filed on Nov. 6, 2008 and entitled "COILS FOR MAGNETIC RESONANCE SPECTROSCOPY AND IMAGING OF HUMAN BREAST," which claims the benefit of U.S. Provisional Application Ser. No. 60/986,253 filed on Nov. 7, 2007, entitled "COILS FOR MAGNETIC RESONANCE SPECTROSCOPY AND IMAGING OF HUMAN BREAST AT HIGH MAGNETIC FIELD." The entireties of these above-noted applications are incorporated herein by reference.

NOTICE OF GOVERNMENT FUNDING

This invention was made with government support under grants NIH 1R01 CA109471-01 A1 and CA118569 awarded by the National Institutes of Health. The government has certain rights in the invention.

BACKGROUND

Magnetic resonance imaging and spectroscopy are non-invasive techniques that allow probing of soft and hard tissue in humans. In addition to being used as diagnostic tools, magnetic resonance imaging (MRI) and magnetic resonance spectroscopy (MRS) can be utilized in interventional procedures. While proton ($^1$H) MRS and MRI has been employed extensively in brain cancer studies, substantially less research and development has succeeded in extracranial cancer research (particularly breast cancer research) through magnetic resonance spectroscopy, in particular at high magnetic fields (e.g., at or above 3 T), in part because of the relative ease of intracranial MRS as compared with extracranial, even though brain cancer has a relatively low incidence compared to some other types of cancer. For example, breast cancer is the most common malignancy and the number-one leading cause of cancer-related death in women. Each year, nearly 465,000 patients die from breast cancer worldwide, and 1,302,000 more women are newly diagnosed with this disease. Due to its relative good prognosis, nearly 4.4 million breast cancer survivors are living today; however, incidence rates of breast cancer are increasing in most countries. Mortality of breast cancer is mostly associated to metastasis. The current therapeutic interventions typically have limited effect in the treatment of metastatic breast cancer and antiestrogen- chemo- and radiation-resistant tumors. Therefore, early detection is critical in breast cancer management.

A possible reason for having a lesser volume of breast cancer (and other extracranial cancer) research and clinical success through MRS is that several disparate techniques are mature and used customarily at the clinic level, even though such techniques have substantive limitations. For instance, one technique readily employed is mammography, yet mammography screening has a false positive rate about 70%-80%. Ultrasonography is another technique that is often utilized in conjunction with mammography; however, ultrasonography has lower specificity (i.e., more false positives) than mammography. Positron emission tomography/computed tomography (PET/CT) is another technique widely utilized and highly sensitive to detect cancer (e.g., breast cancer) and metastasis for tumors larger than 1 cm; sensitivity decreases significantly for smaller tumors.

Since its first observation about half a century ago, magnetic resonance spectroscopy (MRS) has evolved into a practical technique with a great impact on biology and medicine. It is highly sensitive to the chemical environment of biomolecules and has been used to solve three-dimensional (3D) protein structures and to probe protein dynamics and interactions in aqueous solutions. Magnetic resonance imaging (MRI) detects the tissue water signal for imaging the anatomical organ structures. Because it provides high-resolution anatomical images without the use of ionizing radiation, MRI is powerful in identifying neoplastic changes in soft tissues. The MRI sensitivity for cancer detection can be enhanced by the use of exogenous contrast agents.

Regarding MRS and MRI techniques as applied to breast cancer, proton MRS and MRI techniques can differentiate between benign and malignant breast lesions in vivo. MRI has a high sensitivity (typically greater than 99%) in detecting breast cancer, but low specificity (37%-86%) with a high false-positive rate; MRS can improve breast cancer detection specificity. Currently, choline has been typically the only metabolite that has been observed reliably in human breast cancer by proton MRS, reaching a sensitivity and improved specificity of tumor detection of approximately 78% and 86%, respectively.

SUMMARY

The following presents a simplified summary of the innovation in order to provide a basic understanding of some aspects of the innovation. This summary is not an extensive overview of the innovation. It is not intended to identify key/critical elements of the innovation or to delineate the scope of the innovation. Its sole purpose is to present some concepts of the innovation in a simplified form as a prelude to the more detailed description that is presented later.

The innovation disclosed and claimed herein, in one aspect thereof, can include systems and methods capable of detecting magnetic resonance (MR) signals. These systems and methods can excite a first set of chemicals into a first set of multiple-quantum (MQ) states. Also, a plurality of multiple-quantum coherence (MQC) selection gradient pulses can be applied. The plurality of MQC selection gradient pulses can suppress signals from a set of chemicals to be filtered out. Additionally, signals from the first set of chemicals can be acquired during a first acquisition period.

In one embodiment, the innovation comprises a selective multiple quantum coherence (Sel-MQC) sequence for detection of selected chemicals (e.g., polyunsaturated fatty acids (PUFAs), choline or lactate) in samples containing high concentrations of chemicals to be filtered from the signal, with complete suppression of the chemicals to be filtered. For example, one such sequence can be used in cancer and other tissues containing a high concentration of mobile lipid with complete suppression of lipid and water signals in a single scan. Using Sel-MQC techniques as described herein, various chemicals, including but not limited to polyunsaturated fatty acids (PUFAs), lactate, and choline can be detected simultaneously in a single scan, with complete suppression of unwanted lipid and water signals. The Sel-MQC method can also be used to detect drugs (such as antineoplastic agents, e.g., Iproplatin) and can be adapted for simultaneous measurement of characteristic chemicals and selected drugs (e.g., lactate and Iproplatin).

To provide for high specificity while maintaining high sensitivity, a family of proton MRSI (magnetic resonance spectroscopy imaging) systems and methods based on a selective multiple quantum coherence transfer has been developed as described herein. These systems and methods can achieve complete lipid and water suppression in a single scan, which permits detection of low concentration metabolites, such as lactate, choline, and unsaturated lipid molecules as surrogate biomarkers of breast cancer. In some embodiments described herein, this detection can take place simultaneously.

The subject innovation, in an aspect, relates to spin editing techniques that can be used in systems and methods to improve magnetic resonance spectroscopy (MRS) and magnetic resonance spectroscopic imaging (MRSI). Using sequences and techniques discussed herein, magnetic resonance signals of one or more unwanted chemicals (that is, chemicals whose signals are to be filtered out or suppressed) can be suppressed, so that the signal(s) of a first set of chemicals can be obtained without signals from the one or more unwanted chemicals. Information about and differences between the molecular topologies of the first set of chemicals and the one or more unwanted chemicals can be used to design a sequence that suppresses the one or more unwanted chemicals while allowing acquisition of signal(s) from the first set of chemicals. As will be understood, these systems and methods can be used in a variety of settings, such as detecting low concentration signals, or resolving overlapping signals, in samples with high concentrations of unwanted chemicals.

To the accomplishment of the foregoing and related ends, certain illustrative aspects of the innovation are described herein in connection with the following description and the annexed drawings. These aspects are indicative, however, of but a few of the various ways in which the principles of the innovation can be employed and the subject innovation is intended to include all such aspects and their equivalents. Other advantages and novel features of the innovation will become apparent from the following detailed description of the innovation when considered in conjunction with the drawings.

BRIEF DESCRIPTION OF THE DRAWINGS

FIGS. 9A, 9B, and 9C illustrate, respectively, magnetic resonance images of a liquid phantom obtained with a butterfly coil tuned to $^{13}$C Larmor frequency resonance at 7 T, which is substantially the same as the $^{1}$H Larmor frequency at 1.5 T; MRIs of the liquid phantom taken with a volume coil tuned to Larmor frequency of $^{1}$H at 7 T; and MRI of an animal meat phantom taken with the 1H volume coil tuned for a Larmor frequency of proton at 7 T.

DETAILED DESCRIPTION

Figure 1:
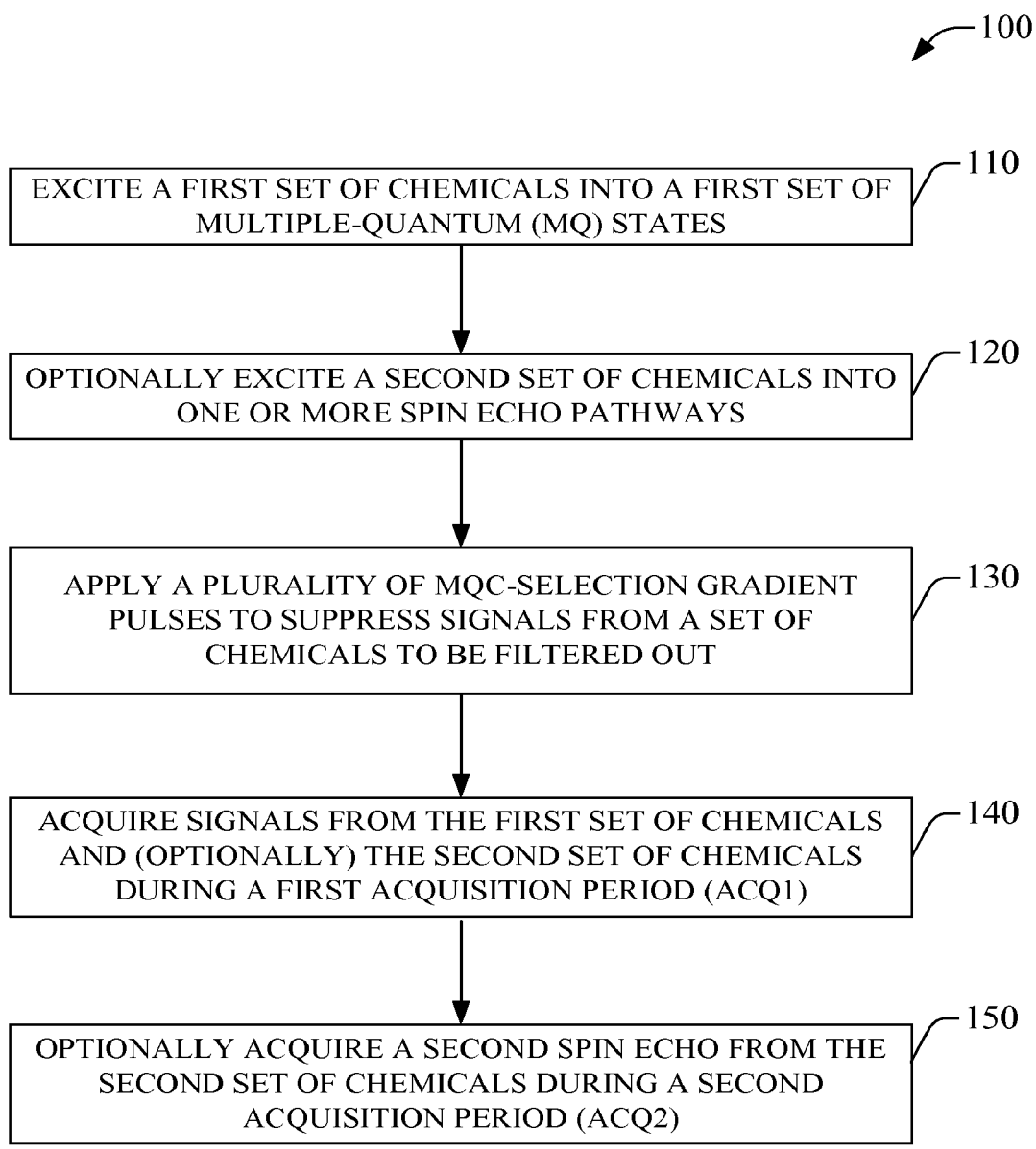
FIG. 1 illustrates an example flowchart of a methodology for selectively obtaining magnetic resonance signals from a first set of chemicals while suppressing unwanted chemicals.

The subject matter is now described with reference to the drawings, wherein like reference numerals are used to refer to like elements throughout. In the following description, for purposes of explanation, numerous specific details are set forth in order to provide a thorough understanding of the present invention. It may be evident, however, that the present invention may be practiced without these specific details. In other instances, well-known structures and devices are shown in block diagram form in order to facilitate describing the present innovation.

As used in this application, the terms "component" and "system" are intended to refer to a computer-related entity, either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution, and a component can be localized on one computer and/or distributed between two or more computers. It is to be appreciated that the innovation described and claimed herein can be facilitated via a component (or group of components) or a system designed for the same.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. As used herein, a "set" refers to a non-empty set unless specifically indicated otherwise, that is, a collection of one or more distinct elements. Moreover, articles "a" and "an" as used in the subject specification and annexed drawings should generally be construed to mean "one or more" unless specified otherwise or clear from context to be directed to a singular form.

Example methodologies that may be implemented in accordance with the disclosed subject matter will be better appreciated with reference to the flowcharts contained in the figures and described herein. While, for purposes of simplicity of explanation, the example methodologies are shown and described as a series of acts, it is to be understood and appreciated that the claimed subject matter is not limited by the number or order of acts, as some acts may occur in different orders and/or concurrently with other acts from what is depicted and described herein. Moreover, not all illustrated acts may be required to implement the methodologies described hereinafter. It is to be appreciated that the functionality associated with the acts may be implemented by software, firmware, hardware, a combination thereof or any other suitable means (e.g., device, system, process, component). Additionally, it should be further appreciated that the example methodologies disclosed hereinafter and throughout this specification can be stored on an article of manufacture to facilitate transporting and transferring such methodologies to various devices or computers for execution by a processor or for storage in a memory. It should be understood and appreciated that a methodology could alternatively be represented as a series of interrelated states or events, such as in a state diagram or call flow.

The subject innovation, in an aspect, relates to spin editing techniques that can be used in systems and methods to improve magnetic resonance spectroscopy (MRS) and magnetic resonance spectroscopic imaging (MRSI). Using sequences and techniques discussed herein, magnetic resonance signals of one or more unwanted chemicals (that is, chemicals whose signals are to be filtered out or suppressed) can be suppressed, so that the signal(s) of a first set of chemicals can be obtained without signals from the one or more unwanted chemicals. Information about and differences between the molecular topologies of the first set of chemicals and the one or more unwanted chemicals can be used to design a sequence that suppresses the one or more unwanted chemicals while allowing acquisition of signal(s) from the first set of chemicals. As will be understood, these systems and methods can be used in a variety of settings, such as detecting low concentration signals in samples with high concentrations of unwanted chemicals, in homo- or heteronuclear MRS experiments.

Turning to the drawings, FIG. 1 illustrates an example flowchart 100 of a methodology for selectively obtaining magnetic resonance signals from a first set of chemicals while suppressing unwanted chemicals. At step 110, the first set of chemicals can be excited into a first set of multiple-quantum (MQ) states. This can prepare the first set of chemicals for simultaneous detection during a single scan. When the first set of chemicals includes more than one chemical, the first set of MQ states can be different states, and the first set of chemicals can be excited into the different MQ states via different coherence transfer pathways. The first set of chemicals can include, for example, one or more of lactate, a polyunsaturated fatty acid (PUFA), etc. However, chemicals which cannot undergo multiple quantum coherence transitions (e.g., choline) cannot be in the first set of chemicals. Optionally, at step 120, a second set of chemicals can be excited into one or more spin echo pathways or other independent pathways. Signals from chemicals which cannot undergo MQC transitions (e.g., choline) can be recovered by exciting them into spin echo pathways or other pathways for later signal acquisition.

At step 130, a plurality of MQC-selection gradient pulses can be applied to suppress signals from a set of chemicals to be filtered out. The plurality of gradient pulses can be designed to selectively remove signals for the set of chemicals to be filtered out. These gradient pulses can be designed based on known information about the first set of chemicals, the second set of chemicals (if they are to be measured), and the set of chemicals to be filtered out (alternatively referred to as "unwanted" chemicals, compounds, molecules, signals, etc., or referred to as chemicals, compounds, molecules, signals, etc. to be removed). These differences can be based on differences in chemical shift between the compounds when exposed to an external magnetic field $B_0$, and can be determined based on known characteristics of the molecular topologies involved. In an example embodiment discussed further herein, the plurality of gradient pulses can comprise five gradient pulses $g_1$ through $g_5$ such that $g_1:g_2:g_3:g_4:g_5 = -5.25:-3:5.25:-7.5:-6$, with an optional pair of crusher gradients $g_6$ as discussed further herein, with amplitude of $-8$.

Turning to step 140, signals from the first set of chemicals and (optionally) the second set of chemicals can be acquired during a first acquisition period ACQ1. Optionally, at step 150, a second spin echo can be acquired from the second set of chemicals during a second acquisition period. In order to acquire the second spin echo, a selective pulse can be used at a resonant frequency of the second set of chemicals, along with a pair of crusher gradients, which can be employed to reduce other signals.

The spin editing techniques discussed herein can be used to selectively remove signals from unwanted chemicals while acquiring signals of interest. Spin network information based on the molecular topology of chemicals can be used to design pulses and pulse sequences to selectively excite the first or second set of chemicals into desired pathways, such as MQC or spin echo pathways. Depending on the chemicals to be detected (e.g., the chemicals in the first and optional second set of chemicals), different chemicals may need to be suppressed. For example, drug concentrations in vivo are typically low, and may require suppression of metabolites (e.g., lactates, lipids). The known molecular structure(s) of unwanted chemicals to be suppressed can be used to select and design parameters for sequences such as those described herein in order to suppress the unwanted chemicals and obtain signals of the first and optional second set of chemicals without signals from the unwanted molecules.

In embodiments, the systems and methods of the subject innovation can be used to selectively obtain magnetic resonance data corresponding to a small number of chemicals of interest (e.g., the first and optional second sets of chemicals), while blocking signals from other chemicals. For in vivo applications, particularly in extracranial applications, lipid and water concentrations are high, and without signal editing such as described herein, can effectively prohibit acquisition of other signals of interest. However, using systems and methods of the subject innovation, particular molecular structures of relatively low concentration can be detected from among a collection of chemicals that include unwanted chemicals of higher concentrations.

Figure 2:
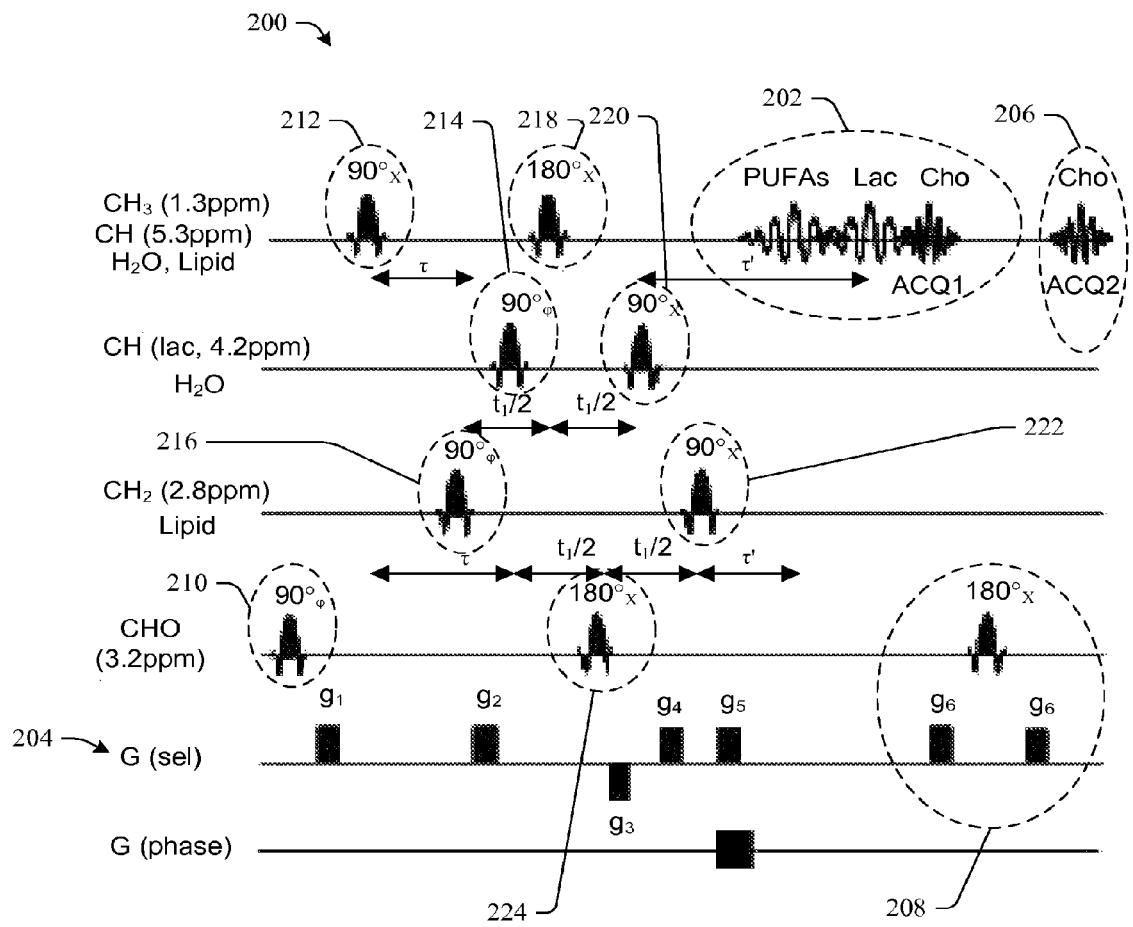
FIG. 2 illustrates an MSC-SelMQC pulse sequence in accordance with an aspect of the innovation.

With continued reference to the drawings, FIG. 2 illustrates an example MSC-SelMQC sequence that can be employed in connection with aspects of the innovation. The example MSC-SelMQC CSI sequence shown in FIG. 2 is modified from the Sel-MQC CSI pulse sequence, and can provide for simultaneous mapping of multiple molecules of interest, including a first set of chemicals (e.g., PUFA, lactate, etc.) and a second set of chemicals (e.g., choline). This example sequence illustrates some of the approaches discussed in connection with FIG. 1 and the associated concepts. For example, some molecules, such as choline, do not go through MQC transitions, but choline signals can be obtained using spin-echo techniques. By varying parameters associated with this example sequence, different molecular structures can be detected, allowing for acquisition of data from chemicals different than in the examples provided herein, and the same or other unwanted chemicals can be suppressed. The example sequence can excite lactate and PUFA (which can be in the first set of chemicals) into different multiple-quantum (MQ)-states via two different MQ coherence transfer pathways, and choline (which can be in the second set of chemicals) into the spin echo pathway for simultaneous detection in the first acquisition period (ACQ1) as shown at item 202, leaving unwanted lipid signals and water (which can be in the set of chemicals to be filtered out) in the SQ modes to be completely suppressed by the MQC-selection gradient pulses g1 through g5 shown on line 204, which, in the example sequence shown, are in the combination g1:g2:g3:g4:g5=−5.25:−3:5.25:−7.5:−6.

A second choline echo 106 can be obtained using a selective 180° pulse at 3.2 ppm and a pair of crusher gradients with amplitude g6=−8, as shown at item 208. The choline magnetization can be excited by a first 90° choline selective pulse 210 and labeled by gradient g1 of line 204. A cosine modulated 1-lobe 90° sin c pulse (e.g., of 10 ms duration) 212 can be applied to excite the olefinic methylene protons of PUFA at 5.3 ppm and the lactate methyl $CH_3$ protons at 1.3 ppm. The exited lactate and PUFA protons can then evolve into anti-phase magnetization via J-coupling in the preparation period of $\tau=1/(2J)$, where J is the scalar coupling constant of lactate or PUFA coupled spins.

A third 90° pulse 214 can be applied at the lactate CH resonant frequency (4.2 ppm) to generate lactate MQ coherence, which can be refocused by the coherence labeling gradient g3:(g4+g5−g2)=1:−2 (as shown on line 204) in the ZQ (zero quantum)→DQ (double quantum) coherence transfer pathway, whereas a gradient g2 as shown on line 204 can serve as a te-crusher. A fourth 90° selective pulse 216 can excite the allylic methylene protons of PUFA at 2.8 ppm to generate PUFA MQC. The PUFA MQC echo is refocused (g2:g5=1:2) via the DQ→ZQ coherence transfer pathway, where g3+g4=2.28 can serve as a t1-crusher. A cosine modulated sin c 180° pulse 218 (e.g., of 10 ms duration) can be applied at the lactate $CH_3$ 1.3 ppm and PUFA at 5.3 ppm to inter-convert the DQ and ZQ conference transfer pathways for both lactate and PUFA. The multiple quantum coherences of both PUFA and lactate can be converted into single-quantum (SQ) states respectively by a last lactate CH 90° sin c pulse 220 at 4.2 ppm and a last PUFA $CH_2$ 90° pulse 222 at 2.8 ppm for detection in the first acquisition window (ACQ1), as shown at 202.

Optionally, choline signals can be refocused twice at 224 and 208 for both a first and second echo acquisition in window ACQ1 at 202 and ACQ2 at 206, respectively. To obtain the images shown in FIG. 3, a 1-lobe sin c pulse (10 ms) was employed as the frequency-selective 90° and 180° pulses for lactate CH, PUFA and Cho excitation (~100 Hz bandwidth). A 12 mm two-compartment phantom was used containing a mixture solution of 50 mM choline and 100 mM lactate in saline in the outer tube and pure vegetable oil in the inner 5 mm NMR tube. A home-built RF coil was constructed to fit the phantom. The experiments were carried out on a Bruker Avance 7 T horizontal bore MRI spectrometer.

The sequence provided in FIG. 2 can be modified to obtain signals from other chemicals than those discussed therein, to suppress signals from other chemicals than those discussed therein, or both. However, the principles are the same as those set forth above. The parameters listed above (e.g., resonance frequencies, timing of pulses) will vary based upon changes in chemicals. The spin coupling network of one or more known molecules can be analyzed to determine one or more resonance frequencies. The pulse sequence described in connection with FIG. 2 can be modified by setting pulses to different resonant frequencies corresponding to the one or more known molecules. Activation frequency offsets of radio frequency (RF) pulses can be changed in order to pick up the one or more known molecules, based at least in part on one or more scalar coupling constants associated with the one or more known molecules. By applying one or more RF pulses at resonance frequency of the one or more known molecules as described herein (e.g., corresponding to two spins coupled to one another), the spin from only the one or more known molecules can be selected and excited into one or more particular pathways (e.g., a MQC transfer pathway or a spin echo pathway). By applying filtering techniques described herein, signals from unwanted molecules in SQ states can be suppressed, and the signal of the one or more known molecules of interest can be recovered.

Figure 3:
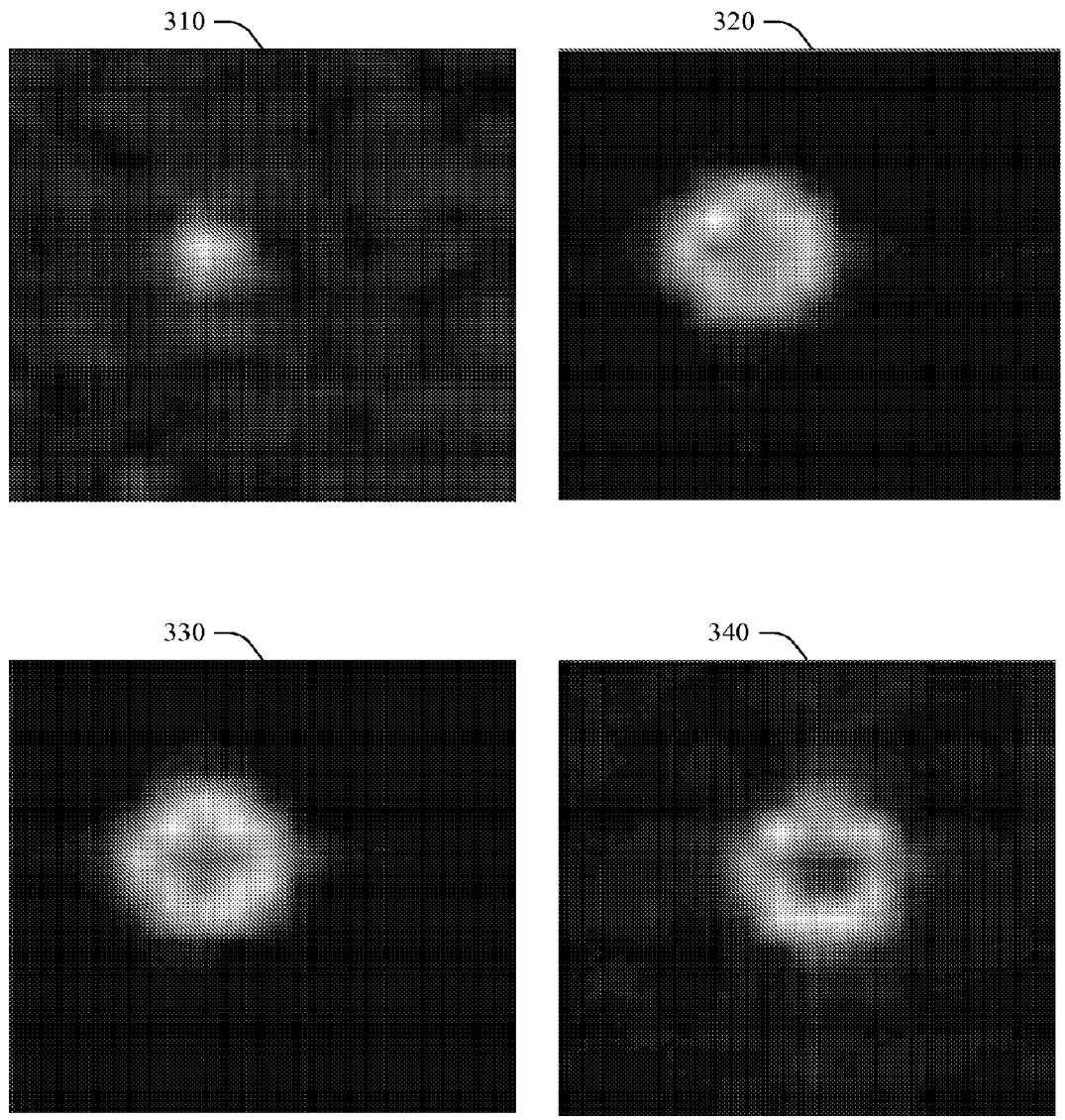
FIG. 3 illustrates two-dimensional image results of an example implementation of the innovation.

FIG. 3 illustrates two-dimensional 16×16 chemical shift imaging (CSI) images of PUFA at 310, lactate at 320, choline acquired in the $1^{st}$ echo (at ACQ1) 330, and choline from the $2^{nd}$ echo (at ACQ2) 340 using the MSC-SelMQC method on a Bruker Avance 7 T MRI spectrometer with a homemade gap-resonator RF coil. As shown in item 340, the second spin echo for choline has a very clean baseline with low contamination of the signal from other sources. The field of view (FOV) was 3 cm. The two-compartment phantom contains a saline mixture of 50 mM choline and 100 mM lactate in the outer tube and pure vegetable oil in the inner tube. Unwanted lipid signals and water were suppressed.

Simultaneous detection of PUFA, lactate, and choline spatial distributions with MSC-SelMQC was demonstrated in phantom (FIG. 2). As expected, the PUFA signals at 5.3 ppm were detected only from the inner chamber (FIG. 2a), and the lactate and choline signals only from the outer chamber with excellent suppression of unwanted lipid signals and water (FIG. 2b,c) in the acquisition window ACQ1. The choline map was also obtained in the $2^{nd}$ acquisition window ACQ2 (FIG. 2d).

In aspects, the innovation can provide for the simultaneous detection of multiple chemicals of interest (e.g., PUFA, lactate and choline) using MSC-SelMQC method with complete suppression of selected signals to be removed or filtered out (e.g., unwanted lipid and water signals). The systems and methods discussed herein can be applied to study animal tumor models and human cancer (e.g., breast or other cancers, extracranial or cranial) in tissues containing a high concentration of fat. Additionally, the innovation can be applied in other contexts, for example, detection or monitoring of diseases with known chemical markers, research to determine whether specific chemical markers are associated with certain diseases, or monitoring the effectiveness of treatment (e.g., radiotherapy, chemotherapy, etc.). These systems and methods can be employed in vivo on both intracranial and extracranial tissue. In the latter case, these systems and methods are superior to traditional MRSI techniques, which produce poor results due to the relatively high concentrations and corresponding signal strengths of lipids and water in extracranial tissue.

Aspects of the innovation relate to improvements in magnetic resonance spectroscopic imaging (MRSI), which is a type of imaging based upon nuclear magnetic resonance (NMR). All atomic nuclei are composed of one or more protons and zero or more neutrons, and the total number of nucleons (protons or neutrons) of an isotope of an element can be written as a superscript number before the chemical symbol of the element, such as $^1H$ (one proton and no neutrons) or $^{13}C$ (six protons and seven neutrons).

All protons and neutrons have an intrinsic angular momentum known as spin that can interact with a magnetic field. Nuclei that have an odd number of protons or neutrons can have a net spin other than zero (most nuclei with even numbers of both protons and neutrons, and as a result, the nucleus can also have a non-zero magnetic moment, $\mu=\gamma S$, where $\mu$ is the magnetic moment, S is the total spin of the nucleus, and $\gamma$ is the gyromagnetic ratio, which depends upon the g-factor of the nucleus in question and the nuclear magneton. Because of the magnetic moment of the nucleus, different nuclear spin levels will correspond to different energy levels when the nucleus is exposed to an external magnetic field. The energy levels of a magnetic moment in a magnetic field are proportional to the amplitude of the magnetic field and to the magnetic moment. The transitions between these energy levels can be detected through MRI, MRS, or MRSI.

In an external magnetic field, the magnetic moment of a nucleus will undergo Larmor precession, processing around the direction of the magnetic field with a frequency called the Larmor frequency which is proportional to the gyromagnetic ratio and the amplitude of the field. Because of the variations in gyromagnetic ratios, the Larmor frequency also varies for different isotopes. As used herein, "$B_0$" refers to an external (frequently uniform and constant) magnetic field primarily responsible for the separation of energy levels. Changes can be induced or measured by altering the magnetic field, such as by applying one or more other magnetic fields, $B_1$ (frequently perpendicular to or having a component perpendicular to $B_0$), for example, one or more fields oscillating at or near the Larmor frequency of a nucleus or nuclei of interest.

Systems and methods of the subject innovation, as well as experimental results and techniques discussed herein, relate to magnetic resonance spectroscopy (MRS) or chemical shift imaging (CSI), and associated conventions, notations, and nomenclature. Some results, system components, or method steps (for example, graphs of frequency response of molecules) may be presented in terms of chemical shift or in parts per million (ppm) relative to a reference frequency, as such measurements are independent of the amplitudes of the external magnetic field, $B_0$ (alternatively, they may also be expressed in terms of units for energy or frequency, e.g., hertz (Hz)). Chemical shift provides information about the environment of a nucleus (e.g., $^{23}Na$, $^{13}C$, etc.) to which coil resonance is tuned, because local geometry (e.g., properties of nearby chemical bonds, such as bond length, bond angle, binding partners, etc.) can cause changes in the energy levels of the nucleus, as the geometry varies the effective magnetic field acting on the nucleus (e.g., because of magnetic fields induced by nearby electrons). This change in energy levels, and hence resonance frequencies, is called chemical shift and is typically described in terms of a fractional change in frequency when compared to a reference, and measured in ppm. Different nuclei in the same molecule can, in general, have different local geometry, and thus different resonant frequencies. Differences and similarities in these factors can contribute to variations in spectra for different chemicals. Healthy tissue, for example, can have certain concentrations of chemicals, each chemical with a specific profile or spectrum of chemical shifts. The set of chemicals in cancerous environments are mostly the same as in healthy tissue, and thus can exhibit mostly the same chemical shift spectrum, but concentrations of each chemical in the set of chemicals are different than in healthy tissue. Accordingly, chemical shift intensity measurements can reveal different profiles of intensity affected primarily by concentration of chemicals, wherein the concentration can be affected by compounds present in cancerous tissue.

One potential application for the systems and methods discussed herein is improved detection of cancer in vivo, as well as monitoring the effectiveness of treatment. Malignant tumors frequently have multiple common tumor-specific markers that systems and methods of the subject innovation can detect to facilitate cancer diagnostics. Magnetic resonance spectroscopy can be sensitive to tumor physiology and biochemistry. Human cancer has specific metabolic characteristics that may be exploited to obtain useful diagnostic and prognostic information. $^1H$ MRS improves the detection sensitivity of metabolites by employing protons, the most abundant and sensitive nuclei in metabolites or drugs. However, traditional proton MRS needs more sophisticated techniques for water and lipid suppression, such as those discussed herein, because the tissue proton spectra of most extracranial organs usually are dominated by intense water and lipid resonances that block observation of metabolites and drugs by traditional MRS. Breast tissue represents the worst case scenario for the $^1H$ MRS observation of metabolites and drugs, due to the elevated lipid levels. Additionally, although traditional MRS has had more success with imaging of the brain, brain tumors can be associated with elevated lipid levels that can interfere with the imaging of metabolites or drugs, unless systems and methods such as those described herein are employed.

The particular metabolic characteristics of tumors can cause several distinguishing chemical markers to be present in them, because neoplastic cells that develop into tumors activate specific metabolic pathways to develop into 3D spheroids and solid tumors. Microregions of heterogeneous cell environments are associated with the development of abnormal vascularization in malignant tumors, which often consist of distended capillaries with leaky walls and sluggish flow, as compared with the regular, ordered vasculature of normal tissues. Despite the constant effort of tumor cells to recruit new blood vessels, there are significant gradients of critical factors for cell growth, such as oxygen, glucose, other nutrients, and growth factors. Hypoxia occurs in tumor cells that are 100-150 $\mu$m away from the nearest blood vessel and tends to be widespread in solid tumors observed as multifoci (or "multiforme"). The anaerobic metabolism of glucose provides a major energy source for tumor cells in hypoxic regions. For example, hypoxia also contributes to processes that directly favor malignant cell progression through effects on the expression and activity of tumor suppressor proteins such as p53. It appears that hypoxia can act as a selective physiological pressure against the survival of wild-type p53 cells in a tumor, thus favoring oncogenesis through enrichment of the population of mutant p53 cells.

A striking common feature of tumor cells is the production of high levels of lactic acid. The last enzyme of glycolysis, lactate dehydrogenase A (LDH-A) is an epidermal growth factor, cAMP, and phorbol ester-inducible protein that has been a widespread prognostic tumor marker. The elevated LDH-A levels will result in increased production of lactic acid within tumor cells.

Systems and methods discussed herein can observe proton signals of metabolites, antineoplastic agents, and unsaturated lipids in tissues with high concentrations of mobile fat. Lactate can be an index of radiation treatment and early chemotherapeutic responses. For example, radiosensitive tumors show a significant decrease in lactate levels at 48 hours after treatment when compared with radioresistant tumors. As an example related to chemotherapy, the lactate levels in RIF-1 tumors has been found to decrease following therapeutic intervention with cyclophosphamide (Cp, 300 mg/kg), which correlates with the increases in tumor perfusion and permeability characterized by the Gd-DTPA (Gadolinium diethylenetriaminepentaacetic acid) uptake curves. The decrease in lactate levels may be due to the increased perfusion and tumor re-oxygenation.

Additionally, magnetic resonance systems and methods can be used to monitor drug effectiveness. Proton detection of drugs in vivo, although highly desirable, has not been very successful in the past for two reasons—low tissue drug concentration and overlapping of drug signals with resonances of metabolites, lipids, or water. To circumvent problems with background signals, $^{19}$F NMR has been used to study pharmacokinetics in tissues. This approach, however, often requires chemical modification of the pharmacological agents.

However, with Sel-MQC systems and methods such as those discussed herein, the proton MR spectrum of a drug has been observed in vivo. Iproplatin, an antineoplastic agent that cross-links nucleotides in both single and double strand DNA molecules and is used in cancer therapy, can be detected selectively in the RIF-1 murine tumor models. The overlapping lactate methyl proton signals and lipid signals can be removed by the MQ-selection gradients using the Sel-MQC sequence. Despite relatively low concentrations of drugs such as Iproplatin in a typical tissue environment as compared with the concentrations of metabolites, lipids and water, it can be detected because of the particular structure of the molecule, which contains twelve protons with each in the same local environment (thus strengthening the corresponding signal by a factor of twelve). Additionally, with editing techniques such as the MSC-SelMQC described in connection with the systems and methods of the subject innovation, other drugs or chemicals in relatively low concentrations could be detected, depending on their structure; $^1$H MRSI systems and methods of the subject innovation are more effective with molecular structures containing a larger number of protons in similar local environments, such as the twelve similar protons of Iproplatin.

In some embodiments, sequences associated with systems and methods described herein can be used to recover signals associated with lactate, or can be modified as described herein to recover signals from metabolites other than lactate. Sequences associated with these embodiments can be utilized to detect signals from multiple metabolites in a single scan with complete lipid and water suppression. Because the detection can occur in a single scan, it can avoid losses in image quality due to motion artifacts.

The in vivo magnetic resonance measurements of lactate level, $^{13}$C-labeled glucose uptake and glycolytic rate, and blood perfusion in tumor tissues of animal tumor models and spontaneous human cancers reflect the physiochemical states of the up-regulation of glucose transporters, glycolytic enzymes, HIF-1 recruited tumor angiogenesis, and tumor cell pH regulation, all of which are related to tumor progression and malignancy. The glycolytic capacity of tumors as measured by lactate production, when normalized for $O_2$ availability, is proportional to the tumor growth rate. High lactate production in fast-growing tumors results from reduced mitochondrial oxidative activity relative to glycolytic capacity to utilize pyruvate. Most rapidly growing tumor cells have the capacity to use much more glucose than their tissue of origin. Additionally, tumors in vivo utilize much more glucose than do tumor cells in culture and produce a large amount of lactic acid. In contrast to cultured cells, cells in solid tumors are exposed to hypoxia, and their mitochondrial oxidative phosphorylation is significantly slowed due to the oxygen requirements of mitochondrial respiratory functions. Three-dimensional tumor growth, therefore, relies on glycolysis.

Rapidly growing malignant tumors have high glycolytic phenotypes due to both the hypoxic tumor microenvironment and genetic changes in the malignant cells. For benign tumors with low growth rates, lactate levels may stay low. Therefore, $^1$H detection of lactate and $^{13}$C measurement of tumor glycolytic rates normalized for tissue oxygen levels may be used to differentiate malignant lesions from benign lesions and normal cells from fibrosis. However, these differentiations may not be able to be resolved by contrast-enhanced MRI and other traditional methods. In contrast, systems and methods in accordance with the subject innovation can suppress selected signals (e.g., water and unwanted lipid signals), allowing for improved detection of target chemicals (e.g., lactate, PUFA, choline, antineopastic agents etc.).

Tumor regions of high permeability often are associated with hypoxia and necrosis and frequently display lower vascular volumes. The difference in tumor microenvironments is coupled with tumor genetic and metabolic changes that can be detected by MRS. For example, a "GPC (glycerophosphocholine) to PC (phosphocholine) switch," which is associated with altered choline phospholipid metabolism in mammary epithelial cells (e.g., increased levels of GPC relative to PC), was observed as an early phenotypic change during tumor progression.

Specifically in reference to breast cancer, breast tissue contains intense lipid and water signals that can present a formidable technical obstacle to the efficient and reliable in vivo proton MRS detection of metabolites as surrogate markers of breast cancer. Traditionally, choline is the only metabolite that has been observed reliably in human breast cancer by single voxel proton MRS. However, choline also has been detected in lactating breast tissue that had a physiologically high metabolism without increase in cell proliferation. Additionally, certain breast cancer types do not have elevated choline. Therefore, choline alone, detected in vivo by $^1$H MRS, may not be a specific marker for breast tissue malignancy. However, in aspects, systems and methods of the subject innovation, can provide for simultaneous detection of choline in connection with other potential markers, such as PUFAs or lactate.

Tumor cells express high levels of fatty acid synthesizing enzymes, use endogenously synthesized fatty acids for membrane biosynthesis, and export large amounts of lipids. Fatty acid molecules can be tumor specific markers. As one example of chemical markers associated with tumors, brain tumors usually present increased choline levels, decreased levels of N-acetyl aspartate (NAA), detectable lactate, and increased lipid concentrations. Aggressive brain tumors in particular produce large amounts of lipids that can interfere with traditional signal acquisition, but which the systems and methods described herein can filter out to perform MRSI for chemicals of interest.

Additionally, in aspects, the subject innovation can be used in conjunction with fast MRSI scanning techniques to speed data acquisition. In connection with MRI, MRS, and MRSI, k-space is a conjugate space to three-dimensional Euclidean space, where the dimensions correspond to conjugate Fourier variables of ordinary spatial variables, and can represent the Fourier transform of a spatial MRI image, etc. As such, images can be obtained by taking Fourier transforms of the corresponding k-space data. Frequently, the center portion of k-space can contain a larger proportion of the information related to signal-to-noise and contrast.

Cartesian k-space mapping of chemicals (e.g., metabolites and PUFA) via Sel-MQC CSI can require relatively long acquisition time (for example, at least 10 min for single-scan data acquisition to image a sagittal slice of human breast tissue). However, fast scanning techniques can be used in conjunction with Sel-MQC systems and methods to accelerate data acquisition. By way of example, a fast scanning technique called the fast Spiral-SelMQC sequence is described herein. However, other fast scanning techniques may be known by those of skill in the art, and can also be employed in conjunction with the subject innovation.

A fast scanning technique such as a fast Spiral-SelMQC sequence employing a rapid spiral k-space sampling scheme can dramatically reduce the time requirements for data acquisition. In an example experiment, Spiral-SelMQC images of PUFA distribution in human breast were acquired using two-interleaved spirals on a 3 T GE Signa MRI scanner. Approximately 160-fold reduction of acquisition time was observed as compared to the corresponding Sel-MQC CSI method with an equivalent number of scans, permitting acquisition of high-resolution PUFA images in minutes. The reconstructed Spiral-SelMQC PUFA images of human breast tissues achieved a sub-millimeter resolution of 0.54×0.54 or 0.63× 0.63 mm$^2$/pixel for FOV (field of view) of 14 or 16 cm, respectively. The Spiral-SelMQC parameters for PUFA detection were optimized in 2D Sel-MQC experiments to suppress monounsaturated fatty acids (MUFA) and other lipid signals.

Figure 4:
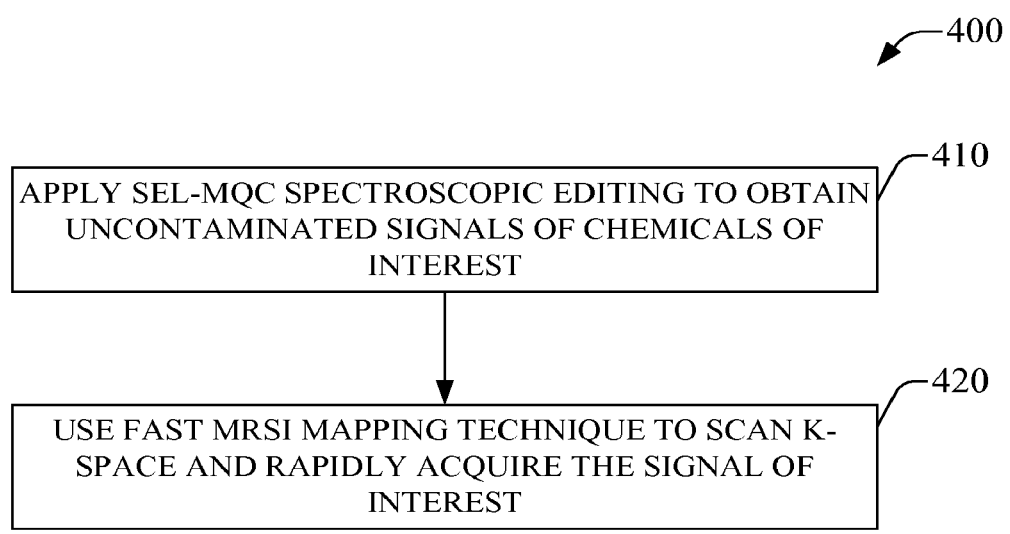
FIG. 4 illustrates a method of employing a fast MRSI technique in connection with aspects of the innovation.

FIG. 4 illustrates a method 400 of employing a fast MRSI technique in connection with aspects of the innovation. To aid in understanding of aspects of the innovation, fast MRSI techniques are discussed in connection with a specific example provided herein (the Spiral-SelMQC), although other fast MRSI techniques can be utilized instead. The Spiral-SelMQC sequence can modify the Sel-MQC systems and methods described herein. It can consist of two steps, as shown in FIG. 4. At step 410, Sel-MQC spectroscopic editing can be applied to obtain uncontaminated signals of chemicals of interest (e.g., PUFA or Monounsaturated Fatty Acids (MUFA) signals), as described in detail herein, and at step 420, a fast MRSI technique (e.g., spiral k-space mapping) can be used to scan k-space and to rapidly acquire the signal of interest.

Any of the systems and methods of acquiring signals via Sel-MQC that are discussed herein can be employed at step 410 to obtain the uncontaminated signal. As an additional example of step 410, the following brief description relates to obtaining a signal of PUFA while removing signals from unwanted lipids and water. Accordingly, for illustrative purposes, specific information relating to these chemicals are included, although other chemicals could be used with corresponding changes made. During the preparation time period τ after the slice-selective 90° pulse, the $AX_2$ spin system evolves according to the Hamiltonian containing chemical shift and J-coupling terms, $H=\omega_1 I_{1z}+\omega_2 I_{2z}+2\pi J_{12}I_{1z}I_{2z}$, where $T_{1z}$, $I_{2z}$ are the z-angular momentum and $\omega_1$ and $\omega_2$ are the chemical shifts of spin A and X, respectively, and $J_{12}$ is the spin-spin coupling constant. The two-spin state is produced under the influence of the J-coupling Hamiltonian term to give the spin density matrix, $\rho=I_{1x}\cos(\pi J_{12}\tau)+I_{1y}I_{2z}\sin(\pi J_{12}\tau)$, where $I_{1z}$ and $I_{1y}$ are the x- and y-angular moment of spin A and X, respectively. When $\tau=1/(2J_{12})$, $I_{1x}$, evolves into the anti-phase magnetization $I_{1y}I_{2z}$. The second 90° pulse can create Zero-Quantum (ZQ) coherence, $I_1^+I_2^-$, and Double-Quantum (DQ) coherence, $I_1^+I_2^+$. Higher multiple-quantum coherences (MQC) can also present in lesser quantities. In contrast, magnetizations from water at 4.7 ppm and lipid protons at 1.3 ppm (or, if other chemicals instead of water and lipids are to be filtered out, the corresponding frequencies of those chemicals) can stay in single-quantum (SQ) state, which can be dephased by MQ-selection gradients. The frequency-selective 180° pulse can be applied at 5.4 ppm (or, if the signal of a chemical other than PUFA is to be detected, the corresponding resonance frequency of that chemical) and can interchange ZQ and DQ coherences during the MQ-evolution time delay, $t_1$, between the second and the last 90° pulses. The last 90° pulse can convert the ZQ and DQ coherences into an anti-phase single-quantum (SQ) magnetization. In the detection period, the anti-phase magnetization evolves under the J-coupling Hamiltonian term into an in-phase magnetization to form a MQ-coherence transfer echo at $\tau'=1/(2J_{12})-t_1$. The remaining magnetization can be dephased by crusher gradients ($G_{crs}$) after data acquisition. A pair of spiral readout gradients ($G_x$, $G_y$) starting at the center of the MQ-coherence transfer echo of PUFA can be applied to achieve rapid 2D k-space mapping in the selected slice. A $t_1$-crusher gradient ($g_1$) and a pair of $t_e$-crusher gradients ($g_{cr}$) can also be applied to spoil the unwanted multiple-quantum coherences and transverse magnetization created by imperfect RF pulses.

If the Spiral-SelMQC technique is selected as the fast MRSI technique, the spiral trajectory can be generated in three stages: (a) constant density spiral mapping in the center of k-space followed by (b) variable density spiral mapping in the slew rate limited case, and finally (c) variable density spiral mapping in the amplitude limited case. This sophisticated trajectory reduces spiral imaging and motion artifacts.

In stage (a), the Glover's constant density spiral trajectory, which defines a trajectory $k_c(\tau)=k_{max}\tau e^{i w_k \tau}$, $\tau \in [0,1]$, can be used in Spiral-SelMQC to sample the k-space center with a constant sampling density, where $k_{max}$, is the radius of the k-space coverage. In this equation, $|k_c(0)|=0$ at the center of k-space when $\tau=0$, and $|k_c(1)|=k_{max}$, when $\tau=1$. Stage (b), the slew rate limited case, can utilize $$\tau(t) = \frac{\frac{1}{2}\beta t^2}{\omega_k\left(\frac{1}{q}+\frac{\beta t 4/3}{2\alpha}\right)}, \text{ where } \alpha = \left(\frac{9}{4}\frac{s_m}{k_{max}\omega_k^3}\right)^{1/3}, \beta = \frac{s_m \gamma}{k_{max}\omega_k^2},$$

$s_m$ is the maximum slew rate, and γ is the gyromagnetic ratio. The constant, q (in one example, q can be 0.2), controls the behavior of τ(t) when t is small. The gradient waveform g(t) as a function of time can be given by:

$$g(t) = \frac{k'(t)}{\gamma} = \frac{k'(\tau) \cdot \tau'(t)}{\gamma}.$$

As the formula of $k_c(\tau)$ implies, the radial distance $|k_c(\tau)|=k_{max}\tau$ is proportional to the angular distance $\theta=\omega\tau$ so that the distance between neighboring spiral lines is constant. In example Spiral-SelMQC experiments for PUFA imaging, the spiral k-space density was set to 1.3 times the nominal density ($\Delta k'=1.3\Delta k$, $\Delta k=1/FOV$). However, in other situations, other values may be preferable, depending on image acquisition time or resolution requirements. As the trajectories reach a certain point in k-space (for example, approximately 25% of $k_{max}$), the algorithm can switch to a variable density trajectory in k-space given by: $k_v(\tau)=k_{max}f(\tau)e^{i\omega\tau}$, $f(\tau)=\alpha\tau^2+b\tau+c$, where $\tau \in [0,1]$ and a, b, and c can be solved using boundary conditions including the two trajectory switching points. In this way, the k-space center (which, as explained above, frequently provides more information of interest) can be oversampled and the sampling density can gradually decrease toward outer k-space. At the end of the trajectories, the sampling density can be less than the nominal density (in the example above, it was about 0.7 times the nominal density).

As an additional illustrative example, in several experiments, spiral gradient waveforms were generated in real time with a two-shot interleaved spiral implemented to acquire the spectroscopic images of PUFA in breast tissues. The $T_1$ relaxation delay TR was 2 s. The total data points per spiral leaf were 2048 for a bandwidth of 125 kHz. The field of view (FOV) in different experiments varied from 12 to 20 cm. The acquired spiral data in k-space was gridded to a corresponding 2D data matrix ranging from 12×12 to 20×20 in size, and then interpolated onto a 256×256 Cartesian matrix. In the re-gridding process, the value at each trajectory point was radially-weighted and transferred to the neighboring points toward the center of k-space on the Cartesian grid. Thus, each Cartesian grid point could accumulate re-gridding values from several neighboring spiral segments. PUFA images were obtained by 2D Fourier transformation of the re-gridded Cartesian Matrix. Reconstructed spiral PUFA images of the human breast had a resolution of 0.54×0.54 or 0.63×0.63 $mm^2$/pixel for FOV=14 or 16 cm.

In these experiments, a fast Sel-MQC sequence with a spiral k-space sampling scheme was demonstrated to selectively detect PUFA or MUFA signals in tissues containing high fat concentration. Spiral-SelMQC maps of PUFA distributions in human breast tissues were obtained in vivo with approximately 160-fold imaging time reduction compared to Sel-MQC CSI experiment with an equivalent number of scans. Thus, fast Sel-MQC spectroscopic imaging techniques may be applied for time-resolved acquisitions to study metabolic processes in human breast cancer or other human diseases, even in extracranial organs where traditional MRSI techniques have been unsuccessful. Spiral-SelMQC parameters can be optimized using 2D Sel-MQC techniques such as the MSC-SelMQC systems and methods discussed herein to suppress signals of chemicals to be filtered (e.g., MUFA and other unwanted lipid and water signals). Metabolites with coupled spins (e.g., lactate) or antineoplastic agents may be imaged similarly within a clinical time limit. The effective Sel-MQC selection of PUFA, MUFA, or metabolite signals depends on their chemical shift differences at high field MRI systems (>2.1 T). Although the specific example of the Spiral-SelMQC technique has been discussed herein, other fast data acquisition techniques may also be employed—e.g., echo-planar methods may be applied to detect multiple metabolites simultaneously in the Sel-MQC methods. On modern MRI scanners equipped with multiple coil array devices, SENSE, SMASH, and GRAPPA or other parallel imaging techniques may be employed in Sel-MQC spectroscopic imaging such as the systems and methods described herein to further improve spatial and temporal resolution of PUFA and metabolite mapping in human breast tissues or other extracranial organs with complete suppression of unwanted lipid and water signals.

Various techniques described herein, for example, the fast MRSI techniques, may be automated to streamline implementation of the systems and methods. For example, particular selections of molecules and corresponding parameters can be pre-determined so as to reduce computational and analytic requirements in a clinical setting while providing high-quality and rapid data acquisition. Multiple sequences can be determined and prepared ahead of time so as to provide diagnostic options for the detection of specific chemicals (e.g., metabolic markers, drugs, etc.) in an accessible format, for example, through a graphical user interface.

As discussed in greater detail next, system(s) and method(s) for magnetic resonance imaging and spectroscopy, and magnetic resonance spectroscopic imaging (MRSI) are provided. Aspects of the subject innovation can be performed with a single coil system, or with a heteronuclear coil system as described in the following systems and methods. An NMR spectrometer used for MRS or MRSI can include some or all of: a magnet to produce the $B_0$ field (generally superconducting, although permanent magnets or non-superconducting electromagnets can be used), a probe that can enable a coil or coils to excite and detect the signal (the coils can form part of a tuned circuit that can be adjusted to various Larmor frequencies, such as those described in connection with FIGS. 8A-B below), an RF transmitter that can deliver pulses, a receiver that can amplify received signals, a digitizer that can convert received signals from analog to digital signals, a pulse programmer that can coordinate timing of pulses and delays, and a computer that can control the other components and can process received data. Additionally, although homonuclear (e.g., $^1H$) techniques can be employed with systems and methods discussed herein, in other aspects, detection techniques can also employ heteronuclear techniques, as described below.

These systems and methods also can be used in conjunction with other systems and methods of the subject innovation, for example, to provide for MRSI data acquisition and calibration in connection with systems or methods employing sequences discussed herein. A unified heteronuclear coil system can include a volume coil tuned to detect a first nuclei and a butterfly coil tuned to detect a second nuclei for simultaneous detection of both the first nuclei and the second signals from tissue (e.g., human breast tissue) and perform MRSI. First nuclei and second nuclei can each include at least $^1H$, $^{13}C$, $^{31}P$, $^{23}Na$, and $^{19}F$, as well as other nuclei, for example nuclei used in contrast agents. The heteronuclear coil system can afford detection of nuclear magnetic resonance (NMR)-detectable chemicals specific to cancerous tissue to improve cancer diagnostic specificity. Adjustment of the heteronuclear coil system to detect various nuclei, combined with a specific pulse excitation sequence, can facilitate chemical analysis that can provide for chemical discrimination and characterization of compounds present in cancerous and other tissue (e.g., breast tissue) as well as healthy physiology (e.g., breast physiology).

Figure 5:
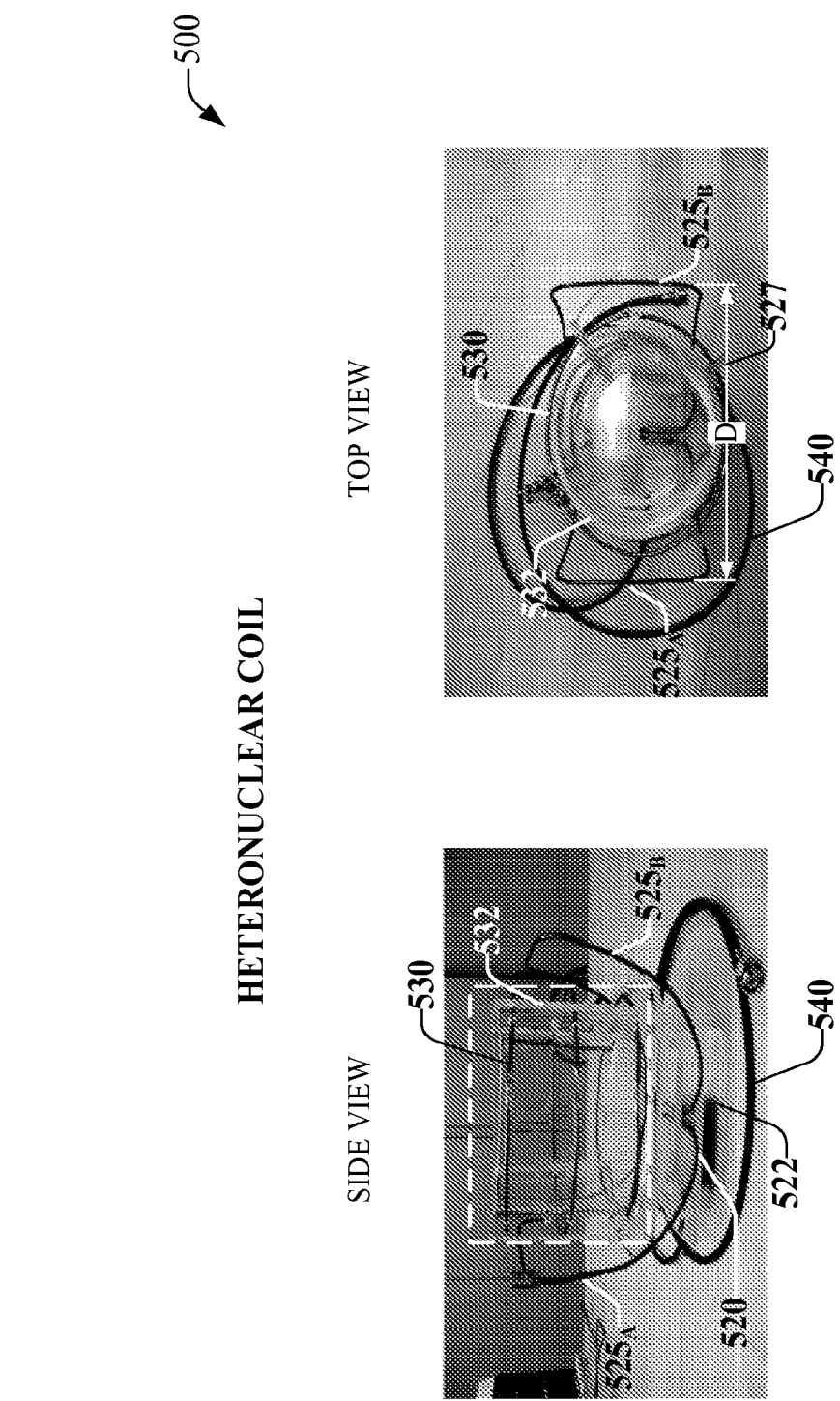
FIG. 5 illustrates an example coil system for MR imaging and spectroscopy of tissue at high magnetic fields.

Referring to FIG. 5, illustrated are two views of an example heteronuclear coil system 500 that can be used for MR imaging and spectroscopy of tissue at high magnetic fields (e.g., 3 T or 7 T) in accordance with systems and methods of the subject innovation. The heteronuclear coil system 500 also can be operated at 1.5 T, which is compatible with 1.5 T MRI scanners ordinarily available in substantially every hospital. Commercial 0.5 T MRI scanners can also employ heteronuclear coil system 500. In an aspect, heteronuclear coil system 500 can allow proton (i.e., $^1H$ nuclei) and carbon (e.g., $^{13}C$ nuclei) signals to be obtained from the same tissue in high-field, whole-body MRI scanners for diagnosis and intervention of diseases. Example heteronuclear coil system 500 includes a butterfly coil 520 that can be employed as an outer coil, and can be tuned to detect signal(s) from $^{13}C$ nuclei, and a volume coil 530 that can be utilized as an inner coil and can detect signal(s) from $^1H$ nuclei. Butterfly coil 520 and volume coil 530 each can be manufactured out of metal wire and each coil can include an electrically insulating (e.g., acrylic) support structure (e.g., structure 522 for butterfly coil 520 and structure 532 for volume coil 530), which can separate the coils from circuitry that, at least in part, can tune and operate the coils. It should be appreciated that in the coil configuration of the example heteronuclear coil system 500, butterfly coil 520 (e.g., tuned to $^{13}$C signal(s)) and volume coil 530 (e.g., tuned to $^{1}$H) can generate probe magnetic fields $B_1$ that can be mutually perpendicular. Spatial uniformity of field $B_1$ dictates at least in part the spatial resolution that can be achieved with heteronuclear coil system 500. It should be appreciated that sensitivity of a coil (e.g., butterfly coil 520, or volume coil 530) to a specific nucleus at a specific external magnetic field ($B_0$) can be determined by matching or tuning the coil's natural resonance frequency, when driven by an RF current, to the Larmor frequency ($v_0$) of a considered nucleus in the external magnetic field ($B_0$): $v_0 = \gamma B_0$, where $\gamma$ is the gyromagnetic ratio of the considered nucleus. Accordingly, through geometrical changes in the coils design, example heteronuclear coil system 500 can allow for probing multiple combinations A/B of nuclei $N_A$ and $N_B$, beyond $^1$H and $^{13}$C, that are nuclear magnetic resonance (NMR) sensitive. Examples of additional nuclei that can be combined and probed with example heteronuclear coil system 500 include, but are not limited to, $^{19}$F, $^{23}$Na, and $^{31}$P. Details of the butterfly and volume coils are discussed next, and where convenient for illustrative purposes, reference will be made to FIGS. 6A-6C and FIGS. 7A-7C, which are diagrams of a butterfly coil 520 and example volume coil(s) 530, respectively.

Butterfly coil 520 (e.g., tuned to $^{13}$C) can present an open-structure configuration, in which hollow copper wires can be bent into a two loops 525$_A$ and 525$_B$. It should be appreciated that while copper wires were employed in the manufacturing of the example coil 520, other metals (e.g., aluminum, silver, or gold) can be utilized as well. In example heteronuclear coil 500, butterfly loops 525$_A$ and 525$_B$ were symmetric and displayed a rectangular section with a height (H) of 11 cm and a width (W) of 13 cm. The distance D 527 between the upper edges of the two loops 525$_A$ and 525$_B$ equaled 16 cm. However, other values can be selected for H, W, and D. Choices of H, W, and D are dictated primarily by application aspects, such as the magnitude of the external magnetic field $B_0$ in which the coil is set to operate; in an aspect, the external magnetic field can be provided by a magnet in a whole-body commercial MRI scanner. Additionally, dimensions are affected by quality of operation (QOO) parameters related to the application, such as uniformity of probe magnetic field (commonly indicated as $B_1$ in the art) generated by the coil; resonator quality factor Q, which can be determined by selection of a set of capacitive components in a tuning/matching circuit; signal-to-noise ratio during detection; and so forth. Furthermore, size of organs to be probed, e.g., human breasts, and patient comfort also determine, at least in part, the size of butterfly loops in a butterfly coil. It should be noted that other geometrical sections can be employed for butterfly loops in a butterfly coil; for example, circular-section loops can be employed to produce a butterfly coil. Moreover, one or more single loops in a butterfly coil can be comprised of multiple constituent loops.

Figure 6A:
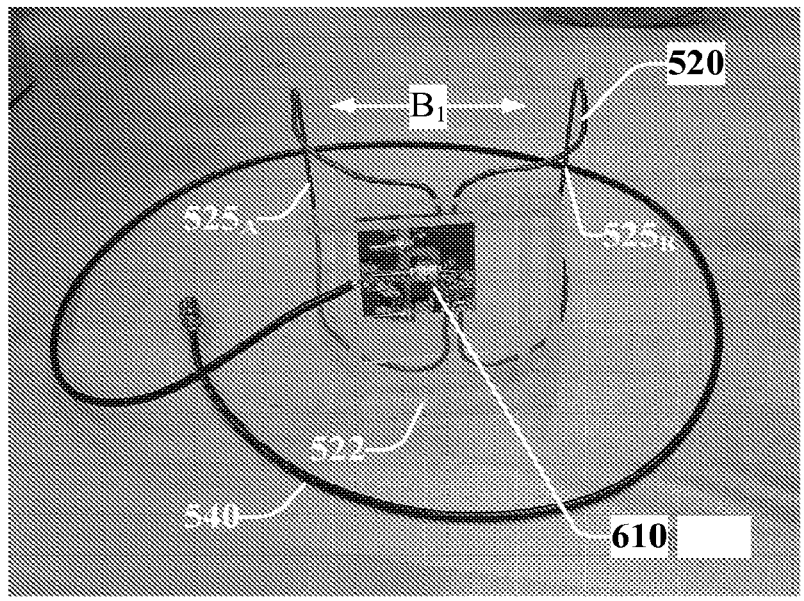
FIGS. 6A-6C illustrate, respectively, an example butterfly coil employed in a heteronuclear coil system, a single-loop flat coil that can be a precursor to a butterfly coil, and two views of a butterfly tape coil in accordance with aspects disclosed in the subject specification.
Figure 6B:
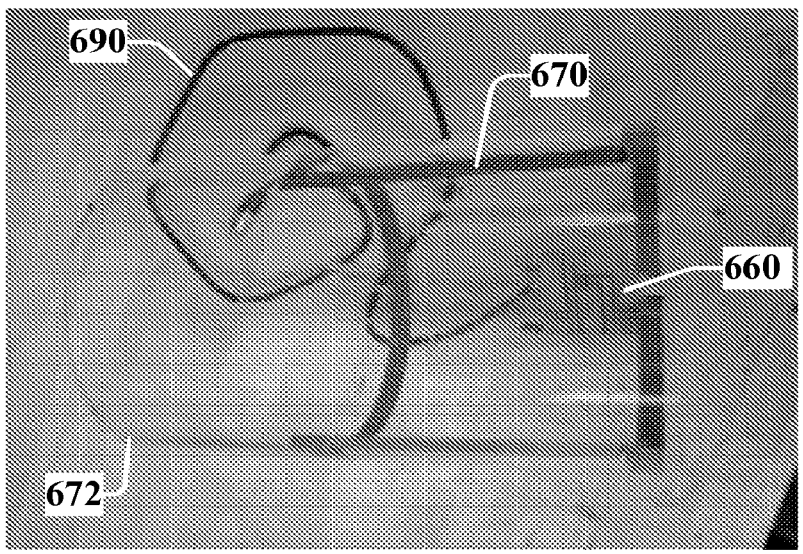
Figure 6C:
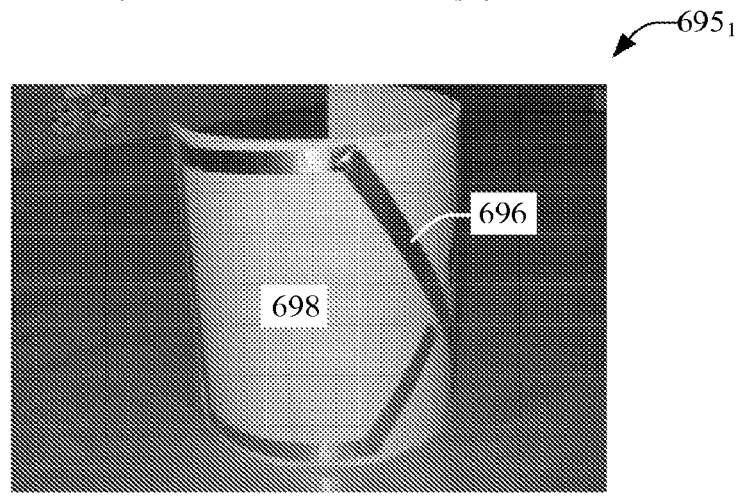
Figure 6C:
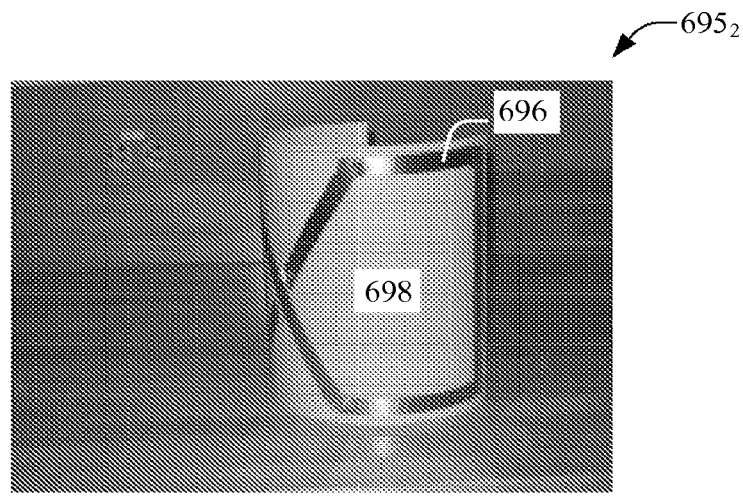

As illustrated in FIGS. 6B-6C, butterfly coils also can be manufactured out of a metal tape (e.g., copper tape) instead of a metal wire. Such metal tape-based coils can be produced from a modification of a single-loop tape-based coil design 650. In FIG. 6B, example single-loop tape coil 670 can be a precursor for a metal tape-based butterfly coil, and can include an insulating structure 672, an RF matching/tuning circuit 660, or inductive-capacitive (LC) matching/tuning circuitry, a coaxial cable 690, or any other link component to an excitation/detection channel. It should be noted that example single-loop tape coil design 650 resonates at the Larmor frequency of $^{13}$C at 3 T, although other such coils can be designed to resonate at the Larmor frequency of the same or other nuclei of interest (e.g., $^1$H, $^{13}$C, etc.) for selected magnetic field strengths. Additionally, although not shown, volume coil(s) also can be constructed employing copper (or other conducting) tapes. In FIG. 6C, a first view 695$_1$ of butterfly tape coil 696 is shown, which illustrates a first loop of the coil. The butterfly coil 696 can be mounted in an insulating structure 698. A second view 695$_2$ of the butterfly coil presents a second loop of butterfly coil 696. Butterfly tape coil 696 can be tuned to resonate at 3 T for at least $^{13}$C and $^{23}$Na Larmor frequency, and displays good sensitivity (−25 dB on a network analyzer).

Coaxial cable 540 can interface an RF tuning/matching circuit 610 (FIG. 6A) coupled to the butterfly coil 520 to an RF analyzer component that can be part of an excitation/detection component. In order to improve the signal-to-noise ratio (SNR) of the signal detected by butterfly coil 520, the length of coaxial cable 540 can be determined at least in part by the Larmor frequency of a nucleus for which nuclear magnetic resonance is to be probed through the butterfly coil; the length of the coaxial cable can typically be half-wavelength at the Larmor frequency, for example, for $^{13}$C at 7 T the half-wavelength is 1.5 meters. The RF tuning/matching circuit can include a set of capacitors connected in parallel or series configuration, with butterfly coil 520 connected to the circuit as an inductive element.

The butterfly coil example design 600 can generate an RF-driven probe magnetic field $B_1$ that is nearly normal to the surfaces enclosed by loops 525$_A$ and 525$_B$, as pictorially indicated in FIG. 6A with an arrow labeled $B_1$. Spatial uniformity of the generated magnetic field $B_1$ can be qualitatively assessed from the quality of images of a phantom sample, which can be a fluid mixture of saline solution and oil, or soft tissue such as a piece of animal meat.

In example heteronuclear coil system 500, the volume coil 530 (e.g., tuned to detect signal from $^1$H) can be a volume transmit/receive coil constructed with three parallel circular loops (e.g., copper loops) that can be equally spaced by a distance (h) (e.g., 4.2 cm). Volume coils, such as volume coil 530, can serve as receive coil(s) if body coil (e.g., such as those commercially available at 3 T and 1.5 T) or other coils are used for RF transmission. Likewise, butterfly coil(s), such as butterfly coil 520, can also serve as a receive coil(s) if a transmit coil(s) is employed. Upon driving volume coil 530 with an RF current, a probe RF magnetic field $B_1$ develops and oscillates, at the driving radio frequency, on the axis of the coil. From MRI experiments on a phantom it has been determined that $B_1$ is substantially uniform (see below). In one example embodiment, each loop can have a diameter (d) of 15 cm, and can includes three equal wire segments (per loop) intercepted with two capacitors with a total capacitance (in a loop) of 1.6 pF, 2.2 pF, and 2.2 pF, respectively, for the upper, middle, and lower loop. It should be appreciated that these parameters can vary and that the capacitors can be mounted in alternative configurations. Additionally, the number and configuration of capacitors that is employed can depend on the magnetic field at which the volume coil 530 is set to operate; for instance, a $^1$H volume coil 530 operating at 7 T can include three pairs of capacitors, whereas a similar $^1$H volume coil operating at 3 T or 1.5 T can operate without capacitors. Volume coils that operate at 7 T also have been constructed with 7 copper loops without segmenting capacitor. In various embodiments, parameters, materials, and circuit elements (e.g., the presence or number of capacitors) can be varied to achieve suitable results. The inductance of a multi-loop volume coil (e.g., FIGS. 7A-7B) is determined by the number of parallel loops and mutual inductance between the wire segments in different loops. Inductive and capacitive aspects can determine a natural frequency of the multi-loop volume coil when driven by radio frequency alternating current. As in butterfly coils (e.g., butterfly coil 520), in a multi-loop volume coil the magnitudes of d and h can be determined by specific application (e.g., external magnetic field, frequency of nuclei to be probed, and so on) and QOO parameters.

It should be appreciated that butterfly coil 520 and volume coil 530 can be operated in disparate channels within an excitation/detection component. Furthermore, multiple channels can be used in embodiments in which more than two coils comprise the heteronuclear coil system 500. It should also be appreciated that matching/tuning circuit design can be effected in a manner that allows utilization of a single RF channel within excitation/detection component. As an example, a $^1$H volume coil and $^{13}$C butterfly coil can be tuned for detection at a specific magnetic field, e.g., 3 T.

Figure 7A:
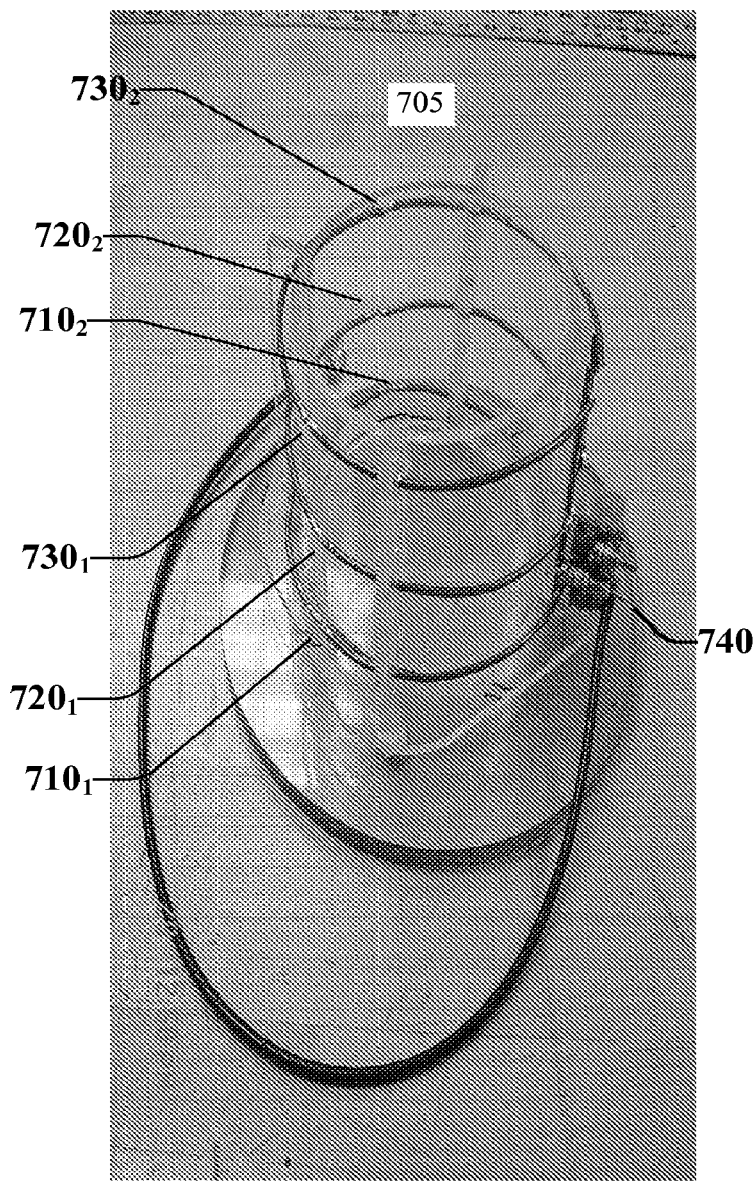
FIGS. 7A-7C illustrate example volume coils that can be employed in heteronuclear coil system(s) in accordance with aspects described in the subject specification.

FIG. 7A, illustrates an example $^1$H volume coil 705 that operates at 7 T. In this example, the capacitors (e.g., 710$_1$ and 710$_2$; 720$_1$ and 720$_2$; and 730$_1$ and 730$_2$) have substantially the same capacitance of 0.5 pF. Each loop in the example volume coil 705 has a diameter of 15 cm, and the spacing between loops is 4.5 cm. As described above, for structural support, the loops (copper loops in this example) in both coils 530 and 705 can be mounted, respectively, on tubes (plastic in this example) of 12.5 cm in length and 10.8 cm (tube 707) of internal diameter, respectively. Here, as with other components discussed herein, the parameters, materials, etc. can be varied depending on the particular applications or needs.

Figure 7B:
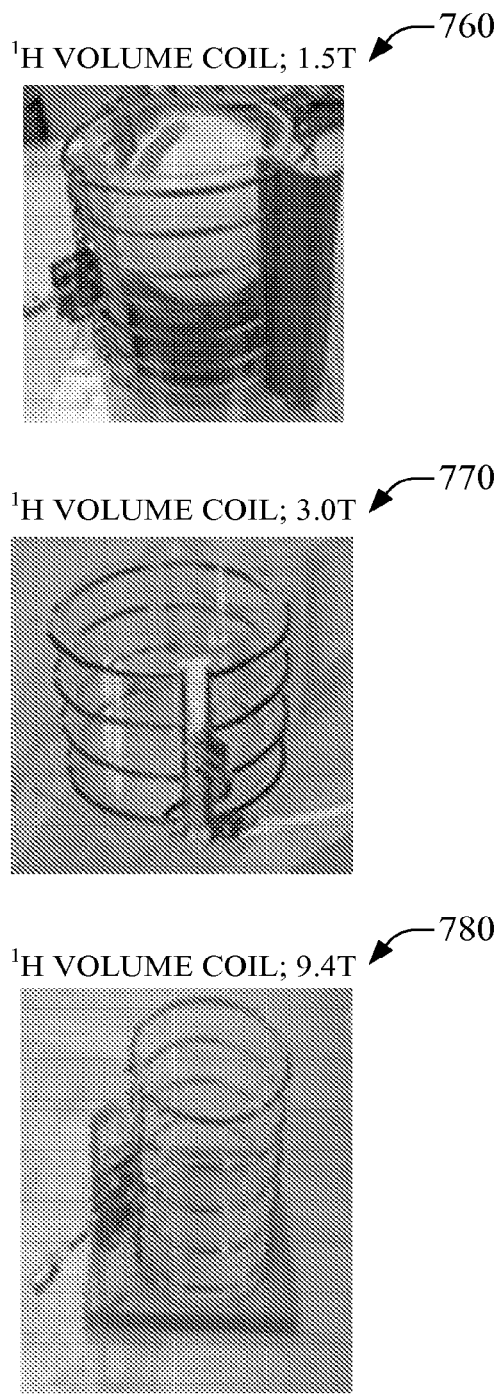

It is noted that, in an aspect of the subject innovation, $^1$H volume coils can comprise multiple loops, and 3-loop $^1$H volume coil 705 is an example realization. The number of loops depends on the magnetic field at which the coil is designed to operate, and other structural parameters like loop size(s) or shape (e.g., radius, eccentricity, etc.) and inter-loop spacing. FIG. 7B illustrates a set of three multi-loop volume coils designed to resonate at disparate $^1$H Larmor frequencies for disparate magnetic fields. Example volume coil 760 resonates at the $^1$H Larmor frequency ($v_L$) at 1.5 T and is manufactured to operate with 7 loops of coaxial copper wire; volume coil 770 resonates at 3.0 T, and volume coil 780 at 9.4 T. It should be noted that each volume coil in the set is supported through a plastic tubular structure. Again, these parameters, materials, etc. are intended only to serve as an example, as other choices can be used in various embodiments.

The N-loop coil inductance is $L_N=(1/N)\times(A/1)$; a factor of N smaller than the inductance in a single loop. A smaller inductance can increase the resonance frequency of the coil when connected in an inductive-capacitive (LC) RF circuit (matching/tuning circuit 740) and driven by an RF current. In the foregoing expression for $L_N$, 1 is the length of a loop in the solenoid (e.g., coil), and A is the area of the loop. Matching/tuning circuit 740 can be attached to the coil to couple it to RF analyzer component, which can be part of an excitation/detection component. Variable capacitors (e.g., with capacitances between 10-50 pF) in a matching/tuning circuit can facilitate tuning the resonance frequency of the coil (see below). Probing the example $^1$H volume coil 530 with a network analyzer, or RF analyzer component, yields a resonance frequency of 297.02 MHz, while the proton Larmor frequency $v_0^{(p)}$ at 7 T is 297.02 MHz. Moreover, the quality factor of example volume coil 530 is approximately 38.

Figure 7C:
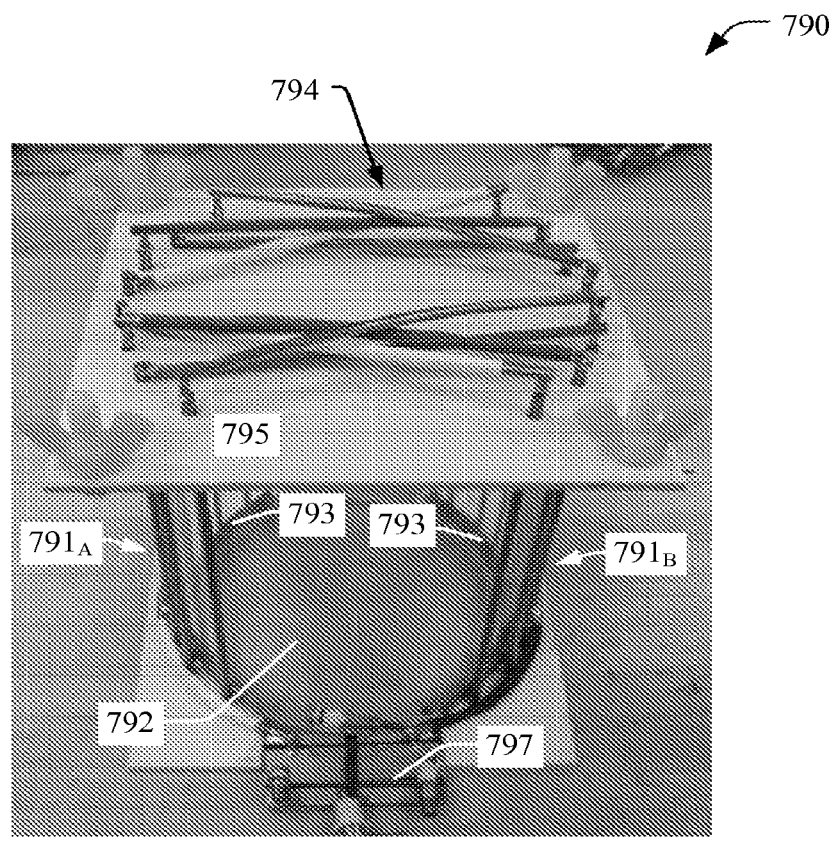

FIG. 7C illustrates an alternative or additional example volume coil 790 that can be employed in a heteronuclear coil system in accordance with aspects described herein. It is noted that to utilize volume coil 790 as a part of a heteronuclear coil system (e.g., heteronuclear coil system 500), active decoupling may be necessary in view of the orientation of the excitation B$_1$ field that volume coil 790 generates. Volume coil 790 can operate, in various embodiments at 3 T, 1.5 T, or at 7 T, and can be tuned to detect signals from various nuclei, including at least $^1$H, $^{13}$C, and $^{23}$Na. Volume coil 790 is a realization of a parallel cosine coil design (PCOS), and generates an excitation B$_1$ field normal to the axis of the coil. In the example embodiment shown, volume coil 790 includes a first group of metal wires 791A and a second group of metal wires 791$_B$, both groups deployed parallel to the surface of a plastic cylinder 792. An LC tuning/matching circuit 797 can facilitate at least in part tuning the volume coil 790 to resonate at a specific Larmor frequency. Metal tapes 793 can connect each group of metal wires on a first end of volume coil 790. On a second end of volume coil 790, wires from disparate groups 791$_A$ and 791$_B$ can be connected via a set of metal wires 794 so as to form loops with surfaces equalized and surface normal vectors that can be orthogonal to the axis of the coil. Capacitors can be included at each joint pair of wires to minimize eddy currents. The second end of volume coil 790 can be covered with an insulating cap 795.

Figure 8A:
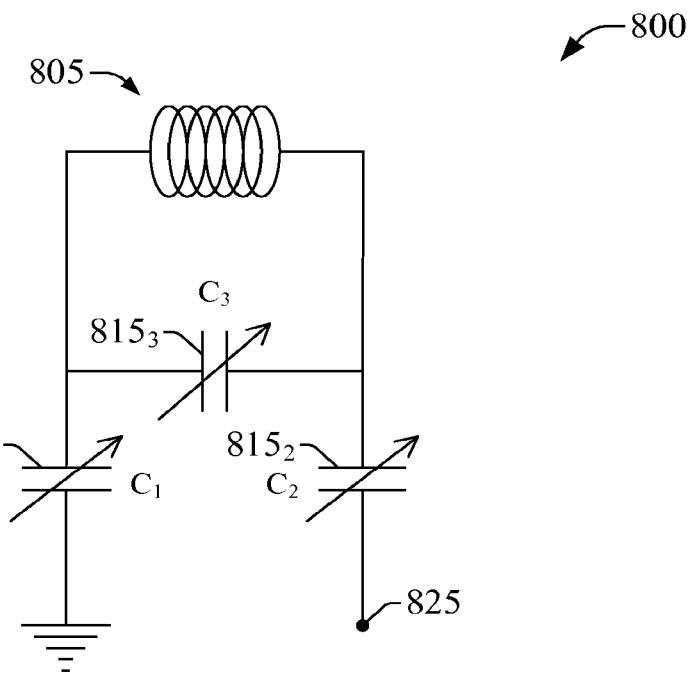
FIGS. 8A and 8B illustrate diagrams of LC matching/tuning circuits that can be employed to operate a coil system for magnetic resonance spectroscopy and imaging in accordance with aspects described herein.
Figure 8B:
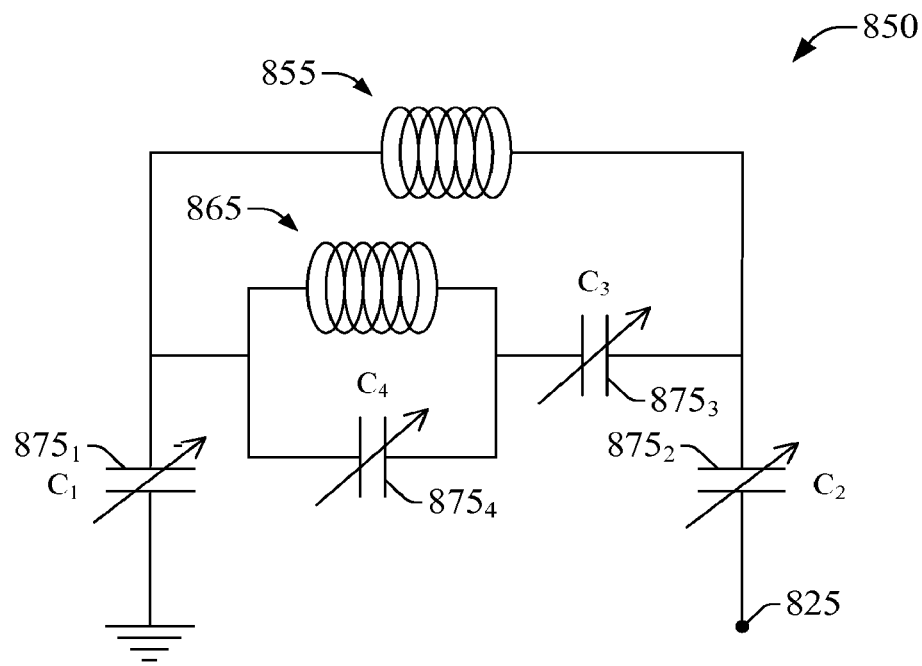

FIGS. 8A and 8B illustrate diagrams of LC matching/tuning circuits 800 and 850, respectively, that can be employed to operate a heteronuclear coil system for magnetic resonance spectroscopy and imaging in accordance with aspects described herein. In example LC tuning/matching circuit 800, three adjustable capacitors can provide matching and tuning: An adjustable tuning capacitor C$_3$ 815$_3$ with a capacitance of up to 40 pF can be connected in parallel with inductive element 805, and two adjustable matching capacitors C$_2$ 815$_2$ and C$_1$ 815$_1$ of up to 15 pF can be connected in series with inductive element 405; the matching capacitors can minimize impedance mismatch between the coil and tuning portion of LC matching/tuning circuit 800. A coil, e.g., a butterfly or volume coil such as those described herein, can be used as inductive element 805. A leg of the LC matching/tuning circuit 400 can be grounded, while the other end can act as an excitation/detection channel 825. The capacitors shown can be used to match the natural resonance of coil 805, when driven by an RF current, to a Larmor frequency for a selected nucleus (e.g., $^1$H, $^{13}$C, $^{31}$P, $^{23}$Na, $^{19}$F, etc.) for a specific static external magnetic field B$_0$.

It should be appreciated that in a heteronuclear coil system, each coil therein can be matched or tuned through an LC matching/tuning circuit 800. In addition, each coil can utilize a channel in an RF analyzer component that can be part of an excitation/detection component that operates the heteronuclear system. As an example, LC matching/tuning circuit 800 can tune butterfly coil 520 to resonate, when RF current drives the coil, with the $^{13}$C Larmor frequency $v_0^{(C)}$ at 7 T. Employing a network analyzer, which can be an embodiment of an RF analyzer component within an RF excitation/detection component, the resonance frequency $(v_B \sim (1/2\pi) \times (LC_3)^{-1/2})$ of butterfly coil 520 can be tuned to 74.67 MHz, which is within 0.5% of the $v_0^{(C)}$=74.97 MHz, the Larmor frequency for $^{13}$C at 7 T.

In LC tuning/matching circuit 850, two inductive elements, each embodied in a coil as described herein, can be connected to four adjustable capacitors. Capacitors C$_1$ 875$_1$ and C$_2$ 875$_2$ can be matching capacitors, and can be connected in series to a double-tune LC pair; namely, first coil 855 can be electrically connected to a first adjustable capacitor C$_3$ 875$_3$, and second inductive element 865 (e.g., an inductor loop) can be connected to a second adjustable capacitor C$_4$ 875$_4$. It is to be noted that the double-tune LC matching circuit 850 can utilize a single coil that can be driven by the first or the second channel of an excitation/detection component, which can detect signals therefrom. As an example, capacitor $C_3$ 875$_3$, with capacitance contributions from $C_4$ 875$_4$ in conjunction with inductive element 865, can be employed to tune coil 855 to resonance with the Larmor frequency of $^1$H for a given $B_0$, while adjustable capacitor $C_4$ 875$_4$ can be utilized to tune coil 855 to resonance with the Larmor frequency of $^{13}$C. As another example, capacitor $C_3$ 875$_3$ can be employed to tune coil 855 to resonance with the Larmor frequency of $^{19}$F, while the $C_4$ 875$_4$, in parallel with inductive element 865, can be employed to tune coil 855 to resonance with the Larmor frequency of $^{23}$Na. It should be appreciated that LC tuning/matching circuit 850 can facilitate tuning a single coil (e.g., a butterfly coil, a volume coil) to resonate at two disparate frequencies, which can correspond to the Larmor frequencies for disparate nuclei in a given $B_0$.

It should be appreciated that design of the double-tune LC tuning/matching circuit 850 can be extended to include additional LC pairs to tune or match additional Larmor frequencies of different nuclei, or to employ multiple coils in parallel imaging through utilization of multiple transmission, or excitation, channels which can be part of an excitation/detection component. In such extensions, additional inductor-adjustable capacitor pairs can be added in parallel to the last tier in a multi-tune scheme. For example, in a triple-tune LC matching/tuning circuit, a parallel arrangement of a third inductor-variable capacitor can be added in series to capacitor $C_4$ 875$_4$. In such configurations, an additional Larmor frequency resonance can be tuned in addition to the two resonances that can be tuned for coil 855. It should be appreciated that in a multi-tune LC matching/tuning circuit for a heteronuclear coil system with more than two inductive elements, coil sensitivity as detected in a detection channel (e.g., channel 825) through a multi-tune LC matching/tuning circuit typically decreases for each inductor-variable capacitor addition. As discussed above, multi-tune LC matching/tuning circuitry can facilitate to tune a single coil to resonate at multiple Larmor frequencies at a specific magnetic field.

FIG. 9A illustrates magnetic resonance images of phantom obtained with a butterfly coil tuned to $^1$H Larmor frequency resonance at 1.5 T, which is substantially equivalent to the $^{13}$C Larmor frequency resonance at 7 T, in order to test spatial uniformity, or homogeneity, of the probe ($B_1$) magnetic field. Phantom 910 was a mixture of 50% oil and 50% water, as a model of fat-water composition in soft tissues, contained in a flask with a diameter of 8 cm. Slices in the images were 1.5 mm wide; slices within the same plane class (e.g., axial, transverse, sagittal, coronal) were spaced by 0.5 mm. Image 920 corresponds to a sagittal slice of the phantom. Water phase and oils phase can be clearly resolved. Images 930, 940, and 950 are slices in a transverse plane. Image 930 presents a phantom slice at the oil phase. The image indicates satisfactory uniformity of the excitation magnetic field ($B_1$) generated with the $^{13}$C butterfly coil. Image 940 corresponds to a phantom slice in the water region, which can be distinguished from image 930. Uniformity in image 940 is also satisfactory. Image 950 is taken in a slice at the interface between oil and water; oil rich areas can be identified as dark spots, while water rich areas have lighter tone. Inhomogeneities in the image contrast can be related to air bubbles formed at the oil-water interface.

FIG. 9B illustrate MRIs of the liquid phantom 910 taken with a volume coil tuned to the Larmor frequency of $^1$H at 7 T. Image 960 presents a sagittal cut of the phantom; the image clearly reveals the oil/water phases of the phantom and air bubbles at the interface, which appear as dark, spotty inhomogeneities. Images 970 and 980 are transverse-plane measurements in the oil phase and water phase, respectively. All three images in FIG. 9B reveal substantive homogeneity of excitation field generated with the employed volume coil. It should be appreciated that the image 980 of water phase presents the expected dielectric effect (e.g., darker outer boundaries in the image of the phantom due to a reduced RF wavelength as a result of high dielectric constant of water). However, many tissues (e.g., breast tissue) have a dielectric constant close to the oil dielectric constant, which is lower than dielectric constant of water, and thus such tissue images acquired employing the $^1$H volume coil can provide a homogeneous, or uniform, $B_1$ field without a strong dielectric effect.

FIG. 9C is a sagittal-slice image of a soft tissue phantom, which is an animal meat phantom. Image resolution is substantially high, and indicates uniformity of excitation field and high signal-to-noise ratio as presented by the high contrast of the image.

Figure 10:
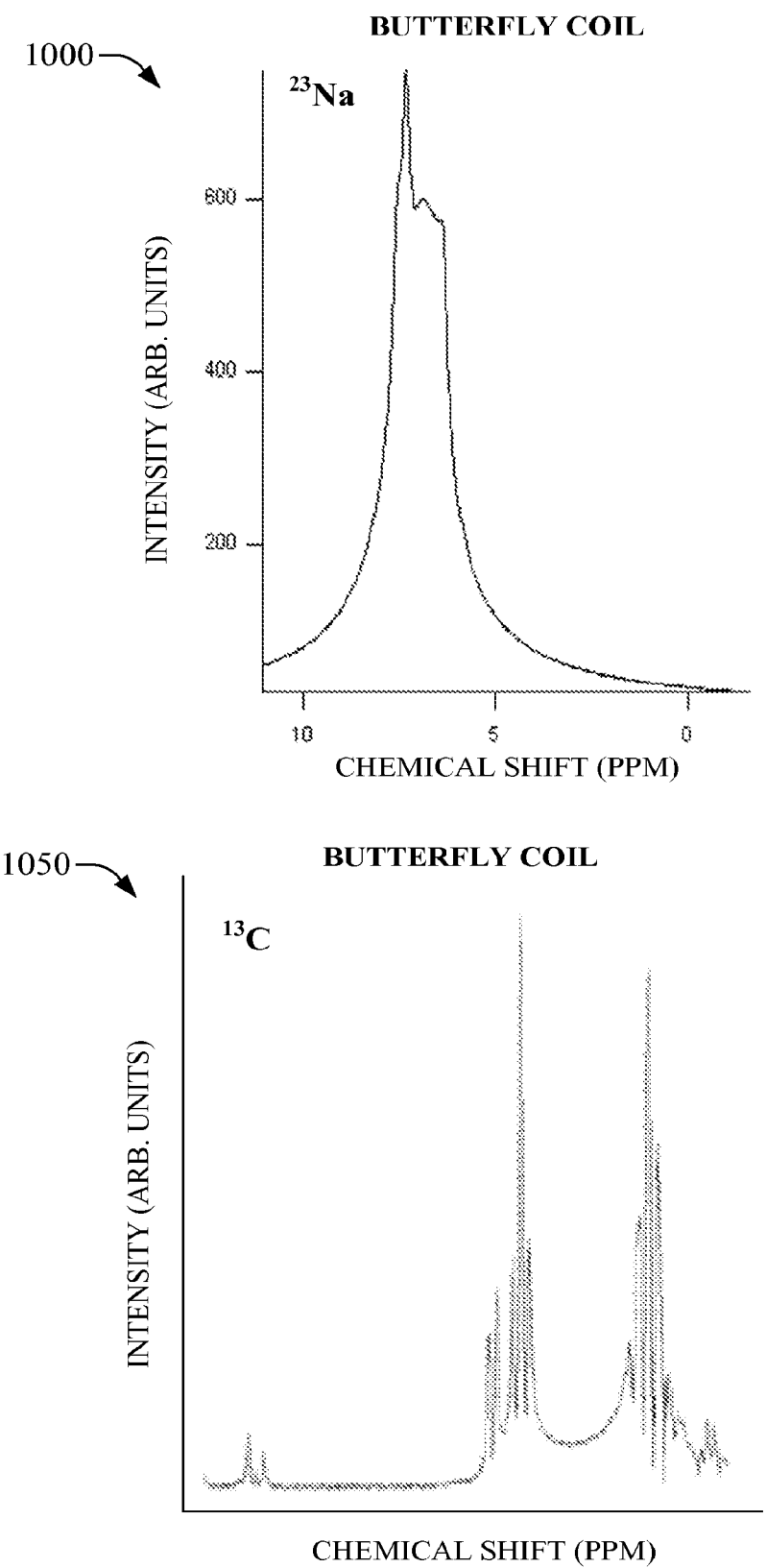
FIG. 10 presents illustrative measurements of a phantom in MR spectroscopy mode conducted with a butterfly coil tuned to resonance at the Larmor frequency at 7 T for $^{23}$Na and $^{13}$C in accordance with aspects described herein.

FIG. 10 presents illustrative measurements of chemical shift from a phantom in MR spectroscopy mode conducted with a butterfly coil tuned to resonance at the Larmor frequencies at 7 T of $^{23}$Na (in graph 1000) and $^{13}$C (in graph 1050). Plot 1000 illustrates $^{23}$Na chemical shift signal intensity from a phantom embodied in a 500 mL bottle of 1M NaCl solution detected using the butterfly coil tuned at 78 MHz. Measurements were performed without shimming in 64 scans on a 7 T Siemens MRI scanner. The repetition time for excitation was set to TR=550 ms, while the echo time was TE=0.35 ms. Plot 1050 illustrates chemical shift for $^{13}$C signal intensity from an oil phantom detected using the butterfly coil tuned at 75 MHz. Repetition time and echo time are substantially the same as the aforementioned TR and TE.

Figure 11:
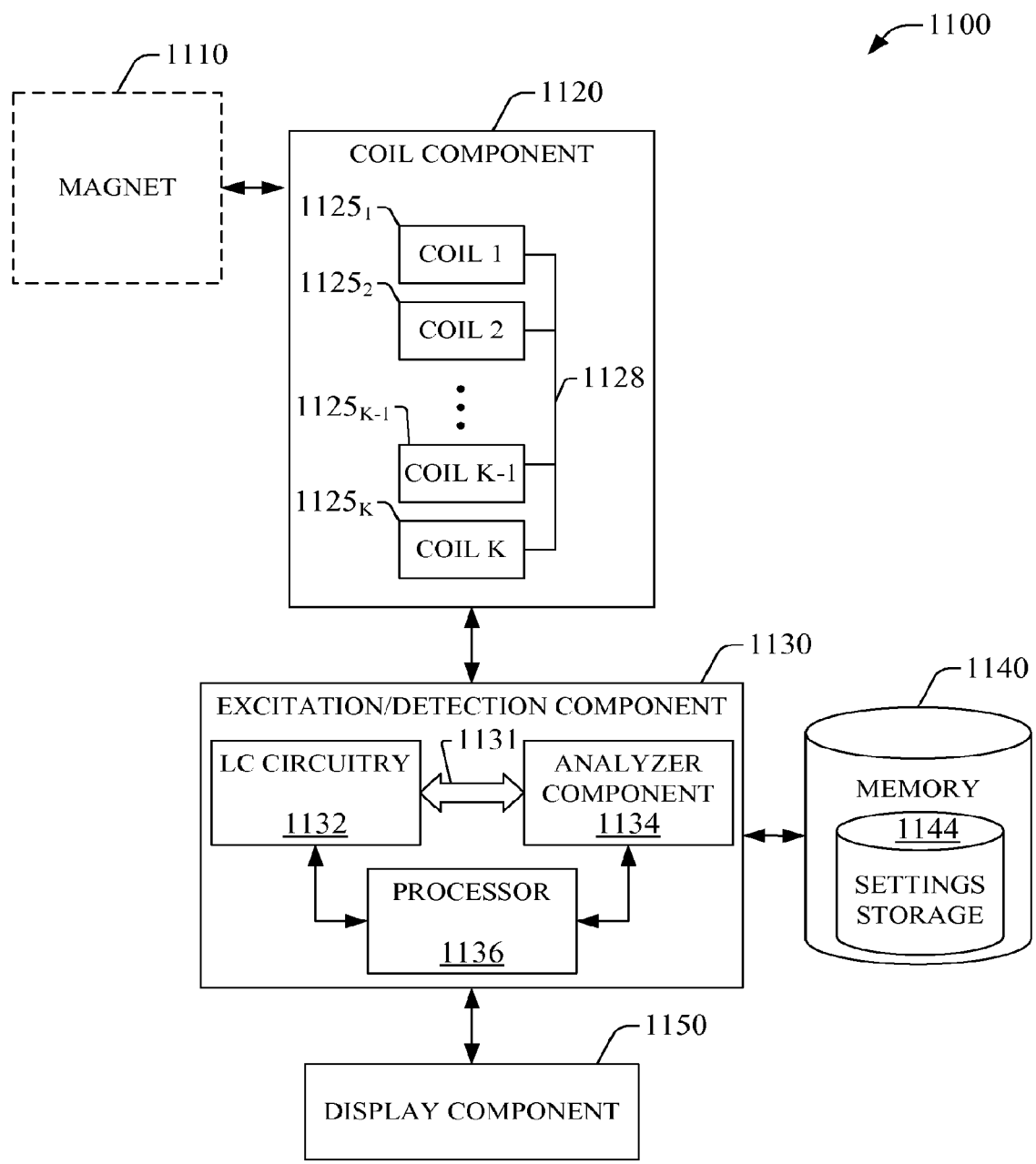
FIG. 11 is an example system that facilitates chemical analysis of soft tissue based at least in part on a heterogeneous coil system in accordance with aspects described herein.

FIG. 11 is an example system that can facilitate chemical analysis of soft tissue (e.g., breast tissue, muscle or joint tissue) disease through a combination of a heteronuclear coil system (e.g., heteronuclear coil system 500) with magnetic resonance spectroscopy (MRS) or imaging (MRI), or magnetic resonance spectroscopic imaging (MRSI) methods. Chemical analysis can include monitoring chemical changes in tissue indicative of cancerous tissue, such as decreased levels of polyunsaturated fatty acids (PUFAs), by selectively detecting certain chemicals that contain the nuclei for which the heteronuclear coil system has been designed. Detection employing heteronuclear coils can target the presence of NMR-detectable chemicals specific to cancerous tissue (e.g., cancerous breast tissue) to improve cancer diagnostic specificity. Additionally, a heteronuclear coil system (e.g., heteronuclear coil system 500) can be used generally for other diseases and studying healthy and abnormal physiology in vivo. It should be appreciated that other chemicals can be monitored as indicators of cancer. The heteronuclear sensitivity of heteronuclear coil system 500 tuned to $^1$H/$^{13}$C nuclei, for example, can be used to study carbon signals from disparate, abundant molecules in healthy and cancerous tissues, including anti-cancer drugs. As indicated above, variations and similarities in local geometry in molecules can cause variations in chemical shift, leading to spectra for molecules. These spectra can be used to determine the structure of or detect the presence of molecules.

Heteronuclear coil system 500, with suitable $N_A/N_B$ combinations of nuclei sensitivity, can be employed for chemical analysis of lipids and metabolites in vivo, like the glucose molecule and its metabolic products, polyunsaturated fatty acids, etc. Additionally, the heteronuclear coil system 500 can be modified to observe substantially any NMR sensitive nuclei in addition to $^1$H and $^{13}$C, such as sodium signals ($^{23}$Na), fluorine signals ($^{19}$F) in anti-cancer drugs such as 5-FU, and phosphorous ($^{31}$P) signals, which were the first NMR modality signals to demonstrate that MRS can detect tumor metabolites that are different from normal tissues.

Generally, chemical structure, chemical content, and chemical reactivity can be discriminated with a heteronuclear coil system (e.g., heteronuclear coil system 500) based on chemical bonding. Chemical reactions between drugs and cancerous tissue can be monitored by a suitable choice of nuclei $N_A$ and $N_B$. It is noted that more comprehensive combinations of nuclei can be established in heteronuclear coil systems that include more than two coils, or heteronuclear coil systems with multi-tuned constituent coils. Similarly, chemical interaction between compounds in cancerous and healthy tissue can be analyzed, as can the chemical reactivity of a compound in healthy tissue and cancerous tissue. It should be appreciated that chemical analysis can be essential to understanding cancer (e.g., breast cancer) in view of the variety of metabolic changes expressed from individual to individual.

In an aspect of the subject innovation, chemical characterization as provided by the heteronuclear coil system (e.g., heteronuclear coil system 500) described herein, can be directed not only to diagnosis of soft tissue (e.g., breast tissue, joint tissue) disease(s) but it can be directed to monitoring treatment thereof. Regarding treatment, chemical characterization through MRSI as facilitated via the heteronuclear coil system(s) described in the subject innovation can be employed to monitor efficacy of a treatment regimen by detecting the biochemical activity of a tumor. Generally, when a treatment drug is going to be therapeutically effective, biochemical activity of a target tumor changes shortly after implementation of the treatment drug. Thus, chemical characterization via MRSI can provide almost immediate feedback in connection with treatment effectiveness, which can allow physicians to switch medications (e.g., treatment drugs) when a current medication fails to show improvement in connection with attacking the tumor. A similar approach can be employed with any other soft tissue disease to which treatment drugs are directed. At least one advantage of such expedited feedback provided by a heteronuclear coil system of the subject innovation is that decision-making time regarding change(s) from an ineffective drug to an effective drug can be greatly reduced, with the ensuing increase in treatment outcomes.

To conduct chemical analysis and MRI, example system 1100 can comprise a magnet 1110 that can provide an external field ($B_0$) and a coil component 1120 (which can be a heteronuclear coil component that can be used as part of a heteronuclear coil system, if it comprises more than one coil) that can include a set of K coils $1125_1$-$1125_K$ (where K is a positive integer) that provide sensitivity to a set of nuclei $n_1$, $n_2$, . . . $n_{K-1}$, $n_K$. Coils $1125_1$-$1125_K$ can be functionally coupled through a coupling element 1128; the coupling element can facilitate mechanical coupling, electrical coupling, electronic coupling, electromagnetic coupling, or any combination thereof. Such coupling can be adjusted for operational selectivity, e.g., selection of a pair of coils that are active in order to determine measurement(s). Coils $1125_1$-$1125_K$ can include volume coils and butterfly coils. In addition, the set of K coils can be employed as a multi-coil array system for excitation/detection, wherein a first subset of the set of coils can include transmitter coils and a second subset can include receiver coils. Each coil in either subset can be driven by a single channel in an excitation/detection component (e.g., component 1130). As an example, for K=2, coil component can employ a butterfly coil (e.g., butterfly coil 520) and a volume coil (e.g., volume coil 530) for chemical discrimination, based upon chemical shift profiles measured through NMR. It should be appreciated that coil component 1120 embodies at least in part coil system 500. Example system 1100 can include an excitation/detection component 1130 coupled to a settings storage 1144 that resides within a memory 1140. In addition, example system 1100 includes a display component 1150 for analysis and manipulation of data.

Excitation/detection component 1130 can include LC circuitry 1132 which includes RF matching/tuning circuitry as discussed above, which can be employed to automatically tune to one or more resonance Larmor frequencies for one or more selected nuclei at the operation external magnetic field ($B_0$) provided by magnet 1110. In addition, component 1130 can include RF electronics, e.g., included within LC circuitry 1132, to generate a sequence of applied pulses (e.g., $\pi/2$ and $\pi$ pulses), which can include application of multiple pulses at specific time intervals such as TE and TR, in order to accomplish specific coherent excitation of nuclear spin targets for monitoring and detection of spin dynamics. As an example, predetermined excitation sequences such as selective single or multiple quantum coherence (Sel-MQC) or substantially any other sequence, as well as parameters relevant to MRSI experiments in particular microscopic parameters associated with probed nuclei (e.g., spin-spin coupling constants, relaxation times ($T_1$) or decoherence times ($T_2$), echo times, repetition times) can be stored in settings storage 1140. Excitation/detection component 1130, through analyzer component 1134, can determine slices (e.g., axial, coronal, or sagittal) for probing intracranial or extracranial tissue (e.g., a human breast, or other organs) and can also process data according to a selected algorithm (e.g., $T_1$-weighting or $T_2$-weighting).

In various embodiments, LC circuitry 1132 can be functionally coupled to an analyzer component 1134 through a link component 1131 (e.g., coaxial cable 540). In an aspect, analyzer component 1134 can include a network analyzer that can facilitate characterization of coil (e.g., coil $1125_2$, or any other coil) resonance features. Analyzer component 1134 can allow direct determination of the coil quality factor (Q) and estimation of a return-loss factor for the coil. In addition, analyzer component 1134 can facilitate, via a Smith chart, assessment of actual inductance and capacitance in the LC circuitry that includes the coils. Moreover, a Smith chart can facilitate adjusting the impedance between LC circuitry 1132 and analyzer component 1134. It should be appreciated that LC circuitry 1132 can include one or more of coils $1125_1$-$1125_K$.

Processor 1136 can confer, at least in part, functionality to one or more components of example system 1100. In an aspect, processor 1136 can execute code instructions in software or firmware in order to provide components with their specific functionality; e.g., a processor can execute code instructions to generate Sel-MQC sequences described herein (e.g., MSC-SelMQC sequences), or any other sequence, utilized to excite one or more coils within coil component 1120. Memory 1140 can retain the code instructions in software or firmware that processor 1136 can execute. In addition, memory 1140 can retain settings storage that includes microscopic parameters associated with operation of coil component 1120 and substantially any component in example system 1100.

Figure 12:
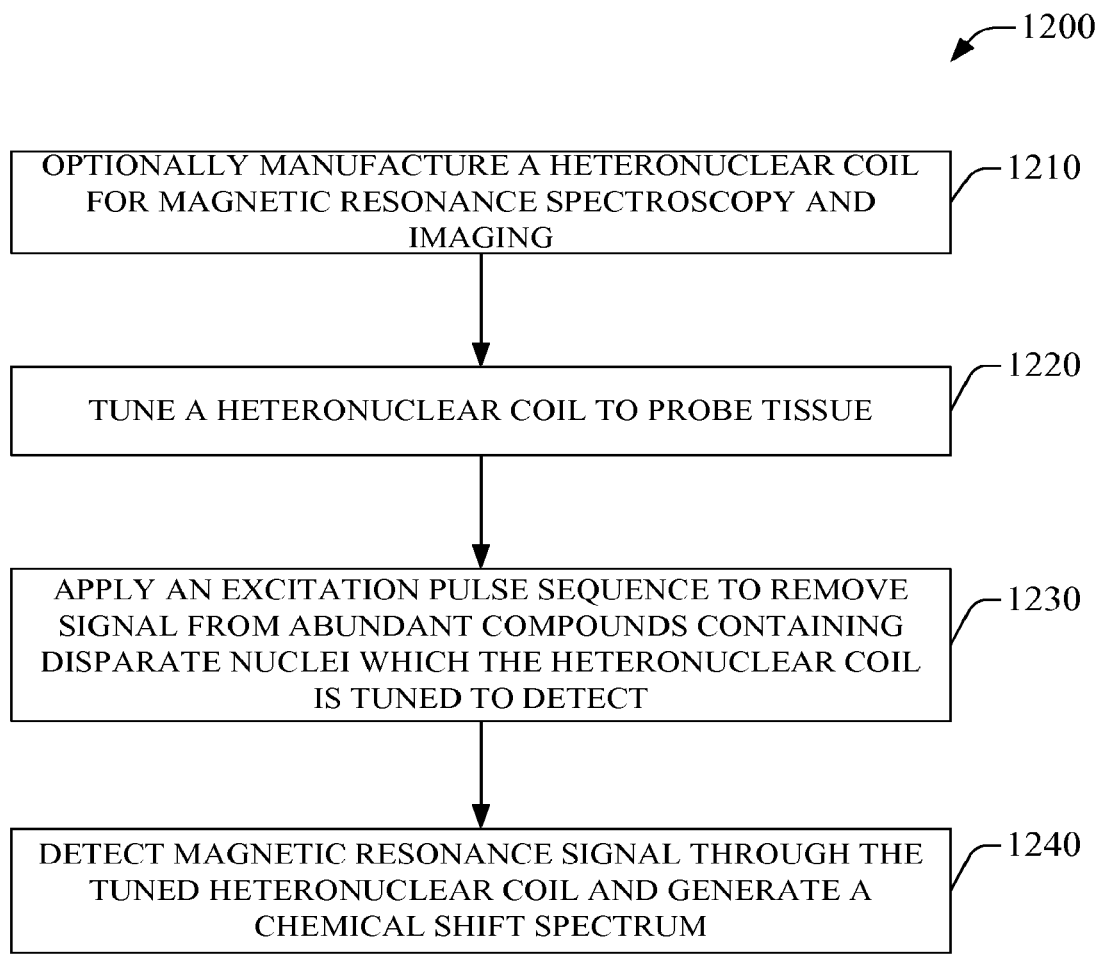
FIG. 12 presents a flow chart of an example method for analyzing chemical constituencies in healthy and cancerous tissue according to aspects described herein.

FIG. 12 presents a flow chart of an example method 1200 for analyzing chemical constituencies in healthy and cancerous tissue (e.g., breast tissue). Optionally, at act 1210, a heteronuclear coil system for magnetic resonance spectroscopic imaging can be manufactured. Alternatively, one already existing can be employed for later steps. The heteronuclear coil system also can be employed for MRS and MRI. Manufacture involves generation of coil loops, assembly of loops in an insulating structure, and production of LC circuitry, according to one or more designs, that can excite a coil and detect signal from the coil. At act 1220 a heteronuclear coil can be tuned to probe tissue. The heteronuclear coil system can be tuned to detect a first type of nuclei and a second disparate type of nuclei in an external magnetic field $B_0$. Tuning refers to adjusting the natural resonant frequency of a coil when driven by an RF current, and can include tuning a butterfly outer coil to detect the first type of nuclei and tuning a volume inner coil to detect the second disparate type of nuclei. Tuning can proceed via inspection of various sizes and shapes for wire loops of a butterfly coil (e.g., butterfly coil 520), as well as diameters and number of loops for a volume coil, e.g., volume coils 530, 705, 760, 770, 780, in addition to adjusting a capacitor within LC circuitry 1132, as a part of RF excitation/detection component 1130. At act 1230, a specific excitation sequence can be applied to the heteronuclear coil in order to remove signal from abundant compounds (e.g., water, lipids) containing nuclei $n_A$ and $n_B$ for which the heteronuclear coils has been tuned. As an example, one such sequence can be a heteronuclear selective multiple quantum-coherence (Heteronucler Sel-MQC) transfer sequence, which can facilitate removal of MRS signals arising from $^1H$ in water and lipids. As another example, a direct or indirect polarization transfer sequence can be employed. As yet another example, a hyper-polarization sequence can be utilized. In this scenario, when a hyper-polarization sequence is utilized with $^{13}C$ detection, heteronuclear coil system may map tumor enzyme activities for cancer detection, resulting in improved diagnostic specificity to differentiate malignant tumors. At act 1240, a magnetic resonance signal can be detected by employing the tuned heteronuclear coil (e.g., coil system 500) and a chemical shift spectrum can be generated. Such detection can result in a spectrum with resonances at disparate frequencies indicative of disparate chemical environments associated with nuclei of types $n_A$ and $n_B$ in a probed organ or tissue. Combining the MRS data with magnetic resonance imaging can result in chemical characterization of healthy and cancerous tissue. In an aspect, detection of magnetic resonance in act 1230 can be directed toward diagnosis of soft tissue (e.g., breast tissue, joint tissue) disease(s) or monitoring of treatment thereof. With respect to treatment, act 1230 can be enacted to monitor efficacy of a treatment regimen by detecting, via MR, the biochemical activity of a tumor. It is to be noted that generally when a treatment drug is going to be effective, biochemical activity of a target tumor changes shortly after implementation of the treatment drug. Thus, detection of MR as described in connection with act 1230 can provide almost immediate feedback in connection with treatment effectiveness, which can allow physicians to switch medications (e.g., treatment drugs) when a current medication fails to show improvement in connection with attacking the tumor, or any other soft tissue disease to which the treatment drug is directed. At least one advantage of the feedback provided by the subject example method 1200, and particularly act 1230, is that decision-making time regarding change(s) from an ineffective drug to an effective drug can be greatly reduced, with the ensuing increase in patient outcomes.

Figure 13:
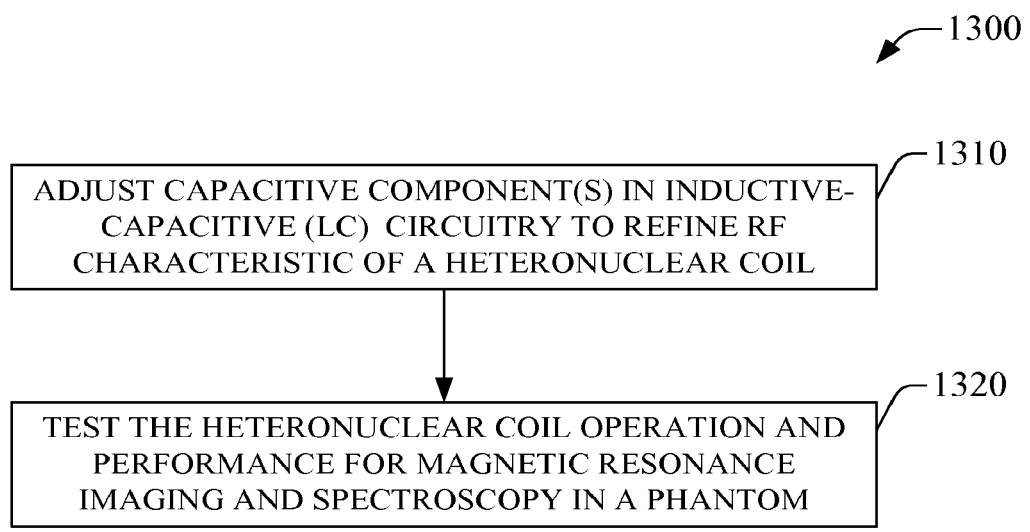
FIG. 13 is a flowchart of an example method for tuning a coil system in accordance with aspects described herein.

FIG. 13 is a flowchart of an example method for tuning a heteronuclear coil system in accordance with aspects described herein. At act 1310, capacitive component(s) in inductive-capacitive (LC) circuitry can be adjusted to refine RF characteristics of a heteronuclear coil. Adjustment of capacitive components depends at least in part upon design of the LC circuitry. In an aspect, multi-tune LC circuitry can demand adjustment of two or more capacitors. Tuning can be automated. At act 1320, the heteronuclear coil operation and performance for magnetic resonance imaging and spectroscopy in a phantom can be tested. Tests can include measurements employing various coils and combinations thereof. In an aspect, phantoms can include combinations of liquids that model soft tissues in humans, or animal meat(s) that can offer a better representation of fatty tissue (e.g., in human breast).

Systems and methods described herein can be used in conjunction with other MRI, MRS, and MRSI techniques. Different sequences and techniques discussed herein can improve the $T_1$- and $T_2$-Sel-MQC sequences and can determine the relaxation times of edited signals for tissue metabolite quantification (e.g., lactate and other signals). The subject innovation can be used in connection with other techniques, such as volume selective Sel-MQC techniques using 1331 composite pulses, a multi-slice Sel-MQC method for 3D mapping of metabolites using the Hadamard matrix approach, or a 3D volume SelMQC spectroscopic imaging technique using spatial-spectral (SPSP) selective radio frequency (RF).

In accordance with aspects of the innovation, modified Sel-MQC sequences for simultaneous detection of one or more sets of chemicals in different multiple quantum coherence transfer pathways have been developed, which can be used in conjunction with double spin-echo methods such as double-spin echo enhanced (DSE)-SelMQC for simultaneous detection of one or more chemicals through spin-echo pathways (e.g., choline) along with other chemicals of interest (e.g., lactate, PUFA, etc.). In various embodiments discussed herein, a novel pulse sequence for Molecular Specific Coherence (MSC)-SelMQC is discussed that permits simultaneous detection of PUFA, lactate and choline in tissues containing high concentration of mobile lipid, with complete suppression of water and unwanted lipid resonances in a single scan.

The subject innovation described herein can provide multiple advantages. One advantage is high detection sensitivity and RF field homogeneity as compared to conventional coil systems to detect cancer-specific biochemicals (e.g., related to breast cancer) containing at least proton ($^1H$), fluorine-19 ($^{19}F$), carbon-13 ($^{13}C$), sodium-23 ($^{23}Na$), phosphorous-31 ($^{31}P$) nuclei. Another advantage is a broad chemical shift range for spectroscopic editing with utilization of homonuclear and heteronuclear Sel-MQC sequence at 3 T and 7 T, which permits detection of potential cancer-specific markers (e.g., breast cancer markers) unavailable conventionally. When utilized with $^{13}C$ hyper-polarization sequence, a heteronuclear coil system of the subject innovation may map tumor enzyme activities for cancer detection, resulting in improved diagnostic specificity to differentiate malignant tumors. Additionally, this innovation can provide diagnosis of soft tissue (e.g., breast tissue, joint tissue) disease(s) or monitoring of treatment thereof.

Although the potential applications discussed in the foregoing have largely focused on cancer (e.g., detection of chemical markers and monitoring of treatment) because of the high demand for improved techniques in that arena and the shortcomings of traditional methods, systems and methods of the subject innovation can be employed in a wider range of settings, as well. Embodiments of the present innovation can be employed in any setting involving MRSI that involves overlapping signals, by using the systems and methods described herein to perform spin editing in order to remove unwanted signals while retaining signals of interest.

In particular examples, these systems and methods can be used to image or monitor transplants or artificial organs. Additional applications include tissue engineering, grown tissues, and stem cell research (as well as potential future therapeutic applications), where these systems and methods can be used to monitor the development of tissue biochemically to distinguish between healthy growth and tumors. In addition, other advantages would be apparent to a person of skill in the art in light of the discussion herein.

As it employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions or acts described herein. A processor may also be implemented as a combination of computing processing units, which can be distributed or deployed in a single location or environment.

In the subject specification, the term "memory" can refer to data stores, algorithm stores, and substantially any other information store relevant to operation and functionality of a component or system comprising the memory; for instance, such information can include excitation pulse sequences, capacitance values to tune a coil system to probe a specific nuclei, microscopic nuclei parameters relevant to MRSI such as computed or measured relaxation times and decoherence times, and so forth. It will be appreciated that the memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), or flash memory. Volatile memory can include random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). Additionally, the disclosed memory components of systems or methods herein are intended to comprise, without being limited to comprising, these and any other suitable types of memory.

Various aspects or features described herein may be implemented as a method; apparatus, either as hardware or hardware and software or firmware; or article of manufacture using standard programming and/or engineering techniques. Implementation(s) that include software or firmware can be effected at least in part through program modules stored in a memory and executed by a processor. The term "article of manufacture" as used herein is intended to encompass a computer program accessible from any computer-readable device, carrier, or media. For example, computer readable media can include but are not limited to magnetic storage devices (e.g., hard disk, floppy disk, magnetic strips . . . ), optical discs [e.g., compact disk (CD), digital versatile disc (DVD), Blu-ray disc (BD) . . . ], smart cards, and flash memory devices (e.g., card, stick, key drive . . . ).

What has been described above includes examples of the innovation. It is, of course, not possible to describe every conceivable combination of components or methodologies for purposes of describing the subject innovation, but one of ordinary skill in the art may recognize that many further combinations and permutations of the innovation are possible. Accordingly, the innovation is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A method of detecting magnetic resonance (MR) signals, comprising:
    exciting a first set of two or more chemicals into a first set of multiple-quantum (MQ) states of two or more MQ-coherence transfer pathways of the corresponding chemicals;
    applying a plurality of multiple-quantum coherence (MQC) selection gradient pulses, wherein the plurality of MQC selection gradient pulses suppress signals from a set of chemicals to be filtered out;
    acquiring signals from the first set of two or more chemicals during a first acquisition period;
    exciting a second set of chemicals into one or more spin echo pathways; and
    acquiring signals from the second set of chemicals during the first acquisition period.

2. The method of claim 1, further comprising:
    applying one or more selective pulses at one or more resonant frequencies of the second set of chemicals;
    applying a pair of crusher gradients to reduce other signals; and
    acquiring a second spin echo signal from the second set of chemicals during a second acquisition period.

3. The method of claim 1, wherein the second set of chemical comprises choline.

4. The method of claim 1, wherein the first set of chemicals comprises one or more of a polyunsaturated fatty acid, lactate, or an antineoplastic agents.

5. The method of claim 1, wherein the set of chemicals to be filtered out comprises one or more of water or a lipid, or other chemicals.

6. The method of claim 1, further comprising applying a fast magnetic resonance spectroscopic imaging (MRSI) technique to scan a k-space.

7. The method of claim 1, wherein the first set of molecules comprises one or more known molecules, and wherein exciting the first set of molecules comprises applying one or more RF pulses based at least in part on one or more scalar coupling constants associated with the one or more known molecules.

8. The method of claim 7, further comprising:
    analyzing a spin coupling network of the one or more known molecules to determine one or more resonance frequencies of the one or more known molecules and one or more scalar coupling constants associated with the one or more known molecules; and
    determining one or more frequency offsets of the one or more RF pulses based at least in part on the one or more scalar coupling constants associated with the one or more known molecules.

9. A magnetic resonance spectroscopic imaging (MRSI) system, comprising:
- a sample that comprises a first set of two or more chemicals, a set of chemicals to be filtered out and a second set of chemicals;
- a magnet that applies a $B_0$ field to the first set of chemicals and the set of chemicals to be filtered out;
- an excitation/detection component that excites the first set of at least two chemicals into a first set of multiple-quantum (MQ) states into different chemical-specific MQ coherence transfer pathways of two or more chemicals, wherein the excitation/detection component applies a plurality of multiple-quantum coherence (MQC) selection gradient pulses, wherein the plurality of MQC selection gradient pulses suppress signals from a set of chemicals to be filtered out, refocuses the signals of two or more chemicals, and wherein the excitation/detection component acquires signals from the first set of at least two chemicals during a first acquisition period and wherein the excitation/detection component excites the second set of chemicals into one or more spin echo pathways, and wherein the excitation/detection component acquires signals from the second set of chemicals during the first acquisition period.

10. The system of claim 9, wherein the excitation/detection component applies one or more selective pulses at one or more resonant frequencies of the second set of chemicals, applies a pair of crusher gradients to reduce other signals, and acquires a second spin echo signal from the second set of chemicals during a second acquisition period.

11. The system of claim 9, wherein the second set of chemical comprises choline.

12. The system of claim 9, wherein the first set of chemicals comprises one or more of a polyunsaturated fatty acid, lactate, or an antineoplastic agents.

13. The system of claim 9, wherein the set of chemicals to be filtered out comprises one or more of water or a lipid, or other chemicals.

14. The system of claim 9, wherein the excitation/detection component applies a fast magnetic resonance spectroscopic imaging (MRSI) technique to scan a k-space.

15. The system of claim 9, wherein the first set of molecules comprises one or more known molecules, and wherein the excitation/detection component applies one or more RF pulses based at least in part on one or more scalar coupling constants associated with the one or more known molecules.

16. The system of claim 9, further comprising:
- a processor that analyzes a spin coupling network of the one or more known molecules to determine one or more resonance frequencies of the one or more known molecules and one or more scalar coupling constants associated with the one or more known molecules, wherein the one or more frequency offsets of the one or more RF pulses are determined based at least in part on the one or more scalar coupling constants associated with the one or more known molecules.

17. A magnetic resonance spectroscopic imaging (MRSI) system, comprising:
- means for producing a $B_0$ field that acts on a sample that contains a first set of molecules;
- means for exciting a first set of chemicals into a first set of multiple-quantum (MQ) states using separate MQ-coherence transfer pathways for different chemicals, wherein the means for exciting further applies a plurality of multiple-quantum coherence (MQC) selection gradient pulses, wherein the plurality of MQC selection gradient pulses suppress signals from a set of chemicals to be filtered out and wherein the means for exciting further excites a second set of chemicals into one or more spin echo pathways; and
- means for acquiring signals from the first set of two or more chemicals during a first acquisition period and wherein the means for acquiring further acquires signals from the second set of chemicals during the first acquisition period.

* * * * *